(12) United States Patent
Ko et al.

(10) Patent No.: US 10,004,124 B1
(45) Date of Patent: Jun. 19, 2018

(54) ELECTROLUMINESCENT DISPLAY DEVICE

(71) Applicant: LG Display Co., Ltd., Seoul (KR)

(72) Inventors: Hoyoung Ko, Paju-si (KR); Juhnsuk Yoo, Seoul (KR); Sungwook Yoon, Goyang-si (KR); Sungwook Chang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/614,305

(22) Filed: Jun. 5, 2017

(30) Foreign Application Priority Data

Feb. 28, 2017 (KR) .......................... 10-2017-0025947

(51) Int. Cl.
| | |
|---|---|
| *H01J 1/62* | (2006.01) |
| *H05B 33/10* | (2006.01) |
| *G09G 3/30* | (2006.01) |
| *H01L 25/04* | (2014.01) |
| *H01L 51/52* | (2006.01) |
| *H01L 27/32* | (2006.01) |
| *G09G 3/14* | (2006.01) |

(52) U.S. Cl.
CPC .............. *H05B 33/10* (2013.01); *G09G 3/14* (2013.01); *G09G 3/30* (2013.01); *H01L 25/048* (2013.01); *H01L 27/3244* (2013.01); *H01L 51/524* (2013.01)

(58) Field of Classification Search
USPC ......................................... 313/498, 506, 512
See application file for complete search history.

(56) References Cited

U.S. PATENT DOCUMENTS

| | | |
|---|---|---|
| 2014/0111563 A1 | 4/2014 | Hwang et al. |
| 2016/0232836 A1 | 8/2016 | Yang et al. |

OTHER PUBLICATIONS

European Extended Search Report, European Application No. 17178318.6, dated Aug. 14, 2017, 10 pages.

*Primary Examiner* — Vip Patel
(74) *Attorney, Agent, or Firm* — Fenwick & West LLP

(57) ABSTRACT

Disclosed is a display device having a display panel including pixels, a pixel circuit of each of the pixels comprising a capacitor connected between a first and second node, a driving transistor connected to the second node, a third node, and a first supply voltage, a first transistor supplying the first supply voltage or a reference voltage to the first node, a second transistor supplying the reference voltage to the second node, a third transistor supplying a data voltage to the first node, a fourth transistor forming a current path between the second and third nodes, a fifth transistor supplying the reference voltage or a reset voltage to the fourth node, a sixth transistor supplying the reference voltage to the first node, a seventh transistor forming a current path between the third and fourth nodes, and a diode connected to the fourth node and a second supply voltage.

23 Claims, 34 Drawing Sheets

ELECTROLUMINESCENT DISPLAY DEVICE

CROSS-REFERENCE TO RELATED APPLICATIONS

This application claims the priority benefit of Korean Patent Application No. 10-2017-0025947 filed on Feb. 28, 2017, which is hereby incorporated herein by reference in its entirety.

BACKGROUND

Technical Field

The present disclosure relates to an electroluminescent display device.

Discussion of the Related Art

Electroluminescent displays are roughly classified into inorganic light-emitting displays and organic light-emitting displays depending on the material of an emission layer of the displays. Of these, an active-matrix organic light emitting display comprises organic light emitting diodes (hereinafter, "OLED") that emit light themselves, and has the advantages of fast response time, high luminous efficiency, high brightness, and wide viewing angle.

An OLED, which is a self-luminous device, comprises an anode and a cathode, and organic compound layers formed between the anode and cathode. The organic compound layers comprise a hole injection layer HIL, a hole transport layer HTL, an emission layer EML, an electron transport layer ETL, and an electron injection layer EIL. When a power supply voltage is applied to the anode and the cathode, a hole passing through the hole transport layer HTL and an electron passing through the electron transport layer ETL move to the emission layer EML, forming an exciton. As a result, the emission layer EML generates visible light.

In an organic light-emitting display, pixels each comprising an organic light-emitting diode and thin-film transistors (hereinafter, "TFT") are arranged in a matrix, and the brightness of an image created by the pixels is adjusted based on the grayscale value of input image data. The TFTs may comprise a driving TFT for adjusting the amount of electrical current in the OLED according to data and a switching TFT for switching a current path in the pixel circuit. The driving TFT controls the drive current flowing through the OLED according to a voltage (hereinafter, "gate-source voltage") applied between its gate electrode and source electrode.

To deliver uniform picture quality without differences in brightness and color between pixels, the driving characteristics of the pixels, such as the threshold voltage Vth and electron mobility p of the driving TFT, should be the same for all the pixels. However, there can be variations in driving characteristics between the pixels due to various causes including process deviation. Moreover, the rate of deterioration can vary between the pixels, depending on the operating time of the display device, thus increasing the differences in driving characteristics between the pixels. Hence, the amount of drive current flowing through the OLED changes with variations in driving characteristics between the pixels, which results in irregularities between the pixels.

In view of this, compensation circuits for compensating for differences in driving characteristics between pixels are now being applied to organic light-emitting displays, in order to improve the picture quality and lifetime of electroluminescent displays. The compensation circuits may use internal compensation or external compensation. In internal compensation, a compensation circuit within a pixel is used to sample the gate-source voltage of the driving TFT, which changes with the electrical characteristics of the driving TFT, and to compensate for a data voltage by the sampled voltage. In external compensation, a sensing circuit connected to a pixel is used to sense the pixel's voltage, which changes with the electrical characteristics of the driving TFT, and an external compensation circuit modulates pixel data (digital data) of an input image based on the sensed voltage.

SUMMARY

In an internal compensation circuit, the brightness of an OLED may be affected by a first supply voltage (Voltage Drain Drain; hereinafter, "VDD") of the pixel. In this case, if VDD varies depending on the position of the pixel within the panel due to a VDD voltage drop (IR drop), this creates a difference between the OLED current and the current required for the pixel, making it hard to obtain uniform picture quality. In order to reduce VDD voltage drop, the line width of the VDD wire may be increased. The term "wire" may refer to any kind of conductive line and is interchangeable with the term "line". However, on a high-resolution panel, the width of the VDD wire should be reduced, and this increases the length of the VDD wire. Thus, high-resolution display panels have their limitations when it comes to improving VDD voltage drop by reducing VDD resistance.

In the internal compensation circuit, a short-circuit may occur between VDD and reference voltage (hereinafter, "Vref") in a reset operation for resetting the pixel, causing an electrical current to flow. Such a short current may increase power consumption and accelerate TFT deterioration.

In the internal compensation circuit, a reference voltage lower than an operating point voltage of the OLED may be applied to the anode of the OLED, in a sampling operation for sampling the threshold voltage of the driving TFT. If the reference voltage applied to the anode of the OLED is increased to the operating point voltage of the OLED, the OLED may unnecessarily emit light in the sampling operation. This phenomenon is known as parasitic light emission and reduces contrast ratio values of the OLED display when the display panel is used to display black. On the contrary, if the reference voltage is reduced to well below the operating point voltage of the OLED, the contrast ratio may be lowered as the luminance is increased when the display panel is used to display black, even though this offers advantages when it comes to preventing unnecessary light emission from the OLED.

Accordingly, the present disclosure is directed to an electroluminescent display device which compensates for variations in the driving characteristics of pixels in real time.

An embodiment of the present disclosure provides an electroluminescent display device having a display panel including a plurality of pixels, a pixel circuit of each of the plurality of pixels comprising: a storage capacitor connected between a first node and a second node; a driving transistor including a gate electrode, a first electrode, and a second electrode, the gate electrode connected to the second node, the first electrode connected to a third node, and the second electrode connected to a first supply voltage; a first transistor connected to the first node, the first transistor supplying the first supply voltage or a reference voltage to the first node in response to a first scan signal, the first supply voltage different from the reference voltage; a second transistor connected to the second node, the second transistor supplying the reference voltage to the second node in response to the first scan signal; a third transistor connected to the first node, the third transistor supplying a data voltage to the first node in response to a second scan signal; a fourth transistor connected to the second node and the third node, the fourth transistor forming a first current path between the second node and the third node in response to the second scan signal; a fifth transistor connected to a fourth node, the fifth transistor supplying the reference voltage or a reset voltage to the fourth node in response to the second scan signal, the reset voltage different from the reference voltage; a sixth transistor connected to the first node, the sixth transistor supplying the reference voltage to the first node in response to an emission control signal; a seventh transistor that is connected to the third node and the fourth node, the seventh transistor forming a second current path between the third node and the fourth node in response to the emission control signal; and an electroluminescent diode with an anode and a cathode, the anode connected to the fourth node and the cathode connected to a second supply voltage, the second supply voltage less than the first supply voltage. Therefore, the present disclosure may achieve uniform picture quality across the entire screen without the need for a VDD wire to have a low-resistance design, and may reduce power consumption since no short-circuit occurs between VDD and Vref.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
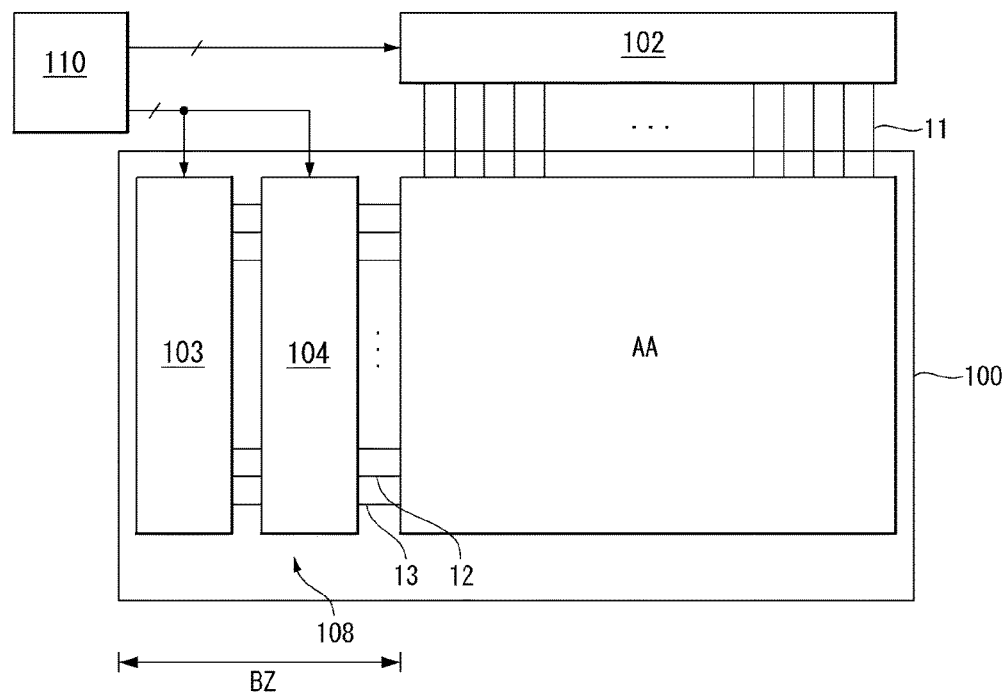
FIG. 1 is a block diagram showing an electroluminescent display device according to an embodiment of the present disclosure.

Various aspects and features of the present disclosure and methods of accomplishing them may be understood more readily by reference to the following detailed descriptions of embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'include' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various embodiments of the present disclosure may be coupled or combined with one another either partly or wholly, and may technically interact or work together in various ways. The embodiments may be carried out independently or in connection with one another.

In the present disclosure, a gate driver may be formed directly on a substrate of a display panel. Transistors that make up a pixel circuit and the gate driver may be implemented as n-type or p-type TFTs with a MOSFET (metal-oxide-semiconductor field-effect transistor) structure. A TFT (or transistor) is a three-terminal device comprising a gate, a source, and a drain. The source is an electrode that supplies carriers to the transistor. The carriers in the TFT flow from the source. The drain is an electrode where the carriers leave the TFT. That is, in the MOSFET, the carriers flow from the source to the drain. In the case of a n-type TFT (or n-type transistor, NMOS), the carriers are electrons, and thus a source voltage is lower than a drain voltage so that the electrons can flow from the source to the drain. Since the electrons in the n-type TFT flow from the source to the drain, current flows from the drain to the source. In the case of a p-type TFT (or p-type transistor, PMOS), the carriers are holes, and thus the source voltage is higher than the drain voltage so that the holes can flow from the source to the drain. Since the holes in the p-type TFT flow from the source to the drain, current flows from the source to the drain. It should be noted that the source and drain of the MOSFET are not fixed. For instance, the source and drain of the MOSFET may vary with the applied voltage. In the embodiments below, the present disclosure is not limited by the source and drain of the TFT.

The transistors that make up the pixel circuit and the gate driver according to the present disclosure may comprise one or more of the following: oxide TFT, amorphous silicon TFT (a-Si TFT), and low-temperature polysilicon (LTPS) TFT.

In what follows, a gate-on voltage is a gate signal voltage at which the TFT can turn on, and gate-off voltage is a voltage at which the TFT can turn off. In PMOS, the gate-on voltage is a gate-low voltage VGL, and the gate-off voltage is a gate-high voltage VGH. In NMOS, the gate-on voltage is a gate-high voltage VGH, and the gate-off voltage is a gate-low voltage VGL.

Each pixel circuit of the present disclosure comprises an electroluminescent diode that is driven by a source-gate-voltage Vsg or a gate-source-voltage Vgs of the driving TFT. In the embodiments below, an organic light-emitting diode will be described as an example of the electroluminescent diode, but the present disclosure is not limited to it.

The following embodiments will be described with respect to an organic light-emitting display. However, the embodiments of the present disclosure are not limited to the organic light-emitting display, and also may be applied to inorganic light-emitting displays including inorganic light-emitting materials—for example, quantum dot displays.

Hereinafter, embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure.

Figure 2:
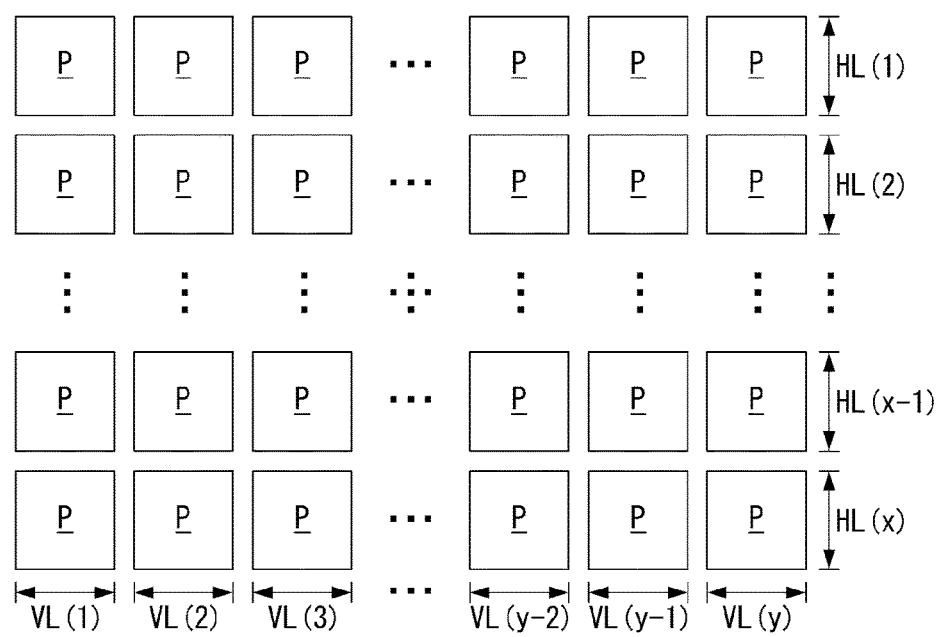
FIG. 2 is a view showing the configuration of a pixel array formed on a screen display part of FIG. 1 according to an embodiment of the present disclosure.

FIG. 1 is a block diagram showing an electroluminescent display device according to an embodiment of the present disclosure. FIG. 2 is a view showing the configuration of a pixel array formed on a screen display part of FIG. 1.

Referring to FIGS. 1 and 2, an electroluminescent display device according to an embodiment of the present disclosure comprises a display panel 100, a data driver 102, a gate driver 108, and a timing controller 110. The gate driver 108 comprises a scan driver 103 and an EM driver 104.

Referring to FIGS. 1 and 2, a plurality of data lines 11 and a plurality of gate lines may intersect on the display panel 100, and pixels are arranged on it. The display panel 100 comprises power supply wires connected commonly to neighboring pixels P. The power supply wires may comprise a VDD wire that supplies a high-level power supply voltage VDD (e.g., a first supply voltage) to the pixels P, a VSS wire that supplies a low-level power supply voltage VSS (e.g., a second supply voltage) to the pixels P, and a Vref wire that supplies a reference voltage Vref, which is higher than the low-level power supply voltage VSS and lower than the high-level power supply voltage VDD, to the pixels P. The power supply wires may further comprise a Vini wire that supplies a reset voltage Vini, which is higher than the low-level power supply voltage VSS and lower than the reference voltage Vref, to the pixels P. The gate lines comprise a plurality of scan lines 12 to which a scan signal is supplied and a plurality of EM signal lines 13 to which an emission control signal (hereinafter, "EM signal") is supplied.

Referring to FIG. 2, a screen display part AA of the display panel 100 comprises a plurality of pixels P, and displays data of an input image on a pixel array consisting of the pixels P. In the screen display part AA, there may be a plurality of horizontal display lines HL(1) to HL(x) (x is a positive integer) formed by horizontally neighboring pixels and a plurality of vertical display lines VL(1) to VL(y) (y is a positive integer) formed by vertically neighboring pixels P. Here, the horizontal display lines HL(1) to HL(x)

and the vertical display lines VL(1) to VL(y) refer to lines of pixel blocks consisting of neighboring pixels P, rather than physical signal lines.

The pixels P may comprise red pixels, green pixels, and blue pixels for color representation, and may further comprise white pixels. Each pixel P may comprise a pixel circuit, as shown in FIGS. 3 to 27.

One frame for driving the pixel circuit may comprise a reset period for resetting a particular node in the pixel circuit, a sampling period for sampling the threshold voltage of the driving TFT included in the pixel circuit, and an emission period for causing the OLED to emit light. A data voltage is addressed to the pixels P in the sampling period. In some cases, the one frame may further comprise a holding period between the sampling period and the emission period. The holding period may be shortened as much as possible or omitted.

A pixel programming period comprising the reset period, sampling period, and holding period is only approximately several horizontal periods, so most of the time during the one frame corresponds to the emission period. The pixels P store a data voltage in the sampling period. Then, the pixels P display data with the same brightness throughout the one frame by the data voltage stored in the sampling period, as they repeatedly turn on and off in response to an EM signal, without getting more data voltage in the emission period subsequent to the holding period.

Referring to FIGS. 1 and 2, the data driver 102 converts data of an input image received from the timing controller 110 to a gamma compensation voltage under control of the timing controller 110 to generate a data voltage, and outputs the data voltage to the data lines 11. The data voltage is supplied to the pixels P through the data lines 11.

Referring to FIGS. 1 and 2, the scan driver 103 generates a scan signal under control of the timing controller 110 and outputs it to the scan lines 12. An (n−1)th scan signal applied to an (n−1)th horizontal display line (n is a positive integer) may be synchronized with an (n−1)th data voltage, and an nth scan signal applied to an nth horizontal display line may be synchronized with an nth data voltage.

Referring to FIGS. 1 and 2, the EM driver 104 generates an EM signal under control of the timing controller 110 and outputs it to the EM signal lines 13. In the EM driver 104, one output terminal is shared by two EM signal lines 13, and this reduces the number of output terminals in the EM driver 104. Once the number of output terminals in the EM driver 104 is reduced, the area the gate driver 108 occupies in the circuit may be decreased, and therefore the size of a bezel area BZ, which is a non-display area, may be reduced by that much.

Referring to FIGS. 1 and 2, the timing controller 110 receives, from a host system, digital video data of an input image and timing signals synchronized with the digital video data. The timing signals comprise a vertical synchronization signal Vsync, a horizontal synchronization signal Hsync, a clock signal CLK, and a data enable signal DE. The host system may be any one of the following: a television system, a set-top box, a navigation system, a DVD player, a Blue-ray player, a personal computer PC, a home theater system, and a mobile information appliance.

The timing controller 110 generates a data timing control signal for controlling the operation timing of the data driver 102 and a gate timing control signal for controlling the operation timing of the gate driver 108, based on a timing signal received from the host system. The gate timing control signal comprises a start pulse, a shift clock, etc. The start pulse may define a start timing at which shift registers of the scan driver 103 and EM driver 104 produce a first output. The shift registers start to operate upon receipt of the start pulse, and produce a first output signal at a first clock timing. The shift clock controls the timing for the shift registers to shift outputs.

Figure 3:
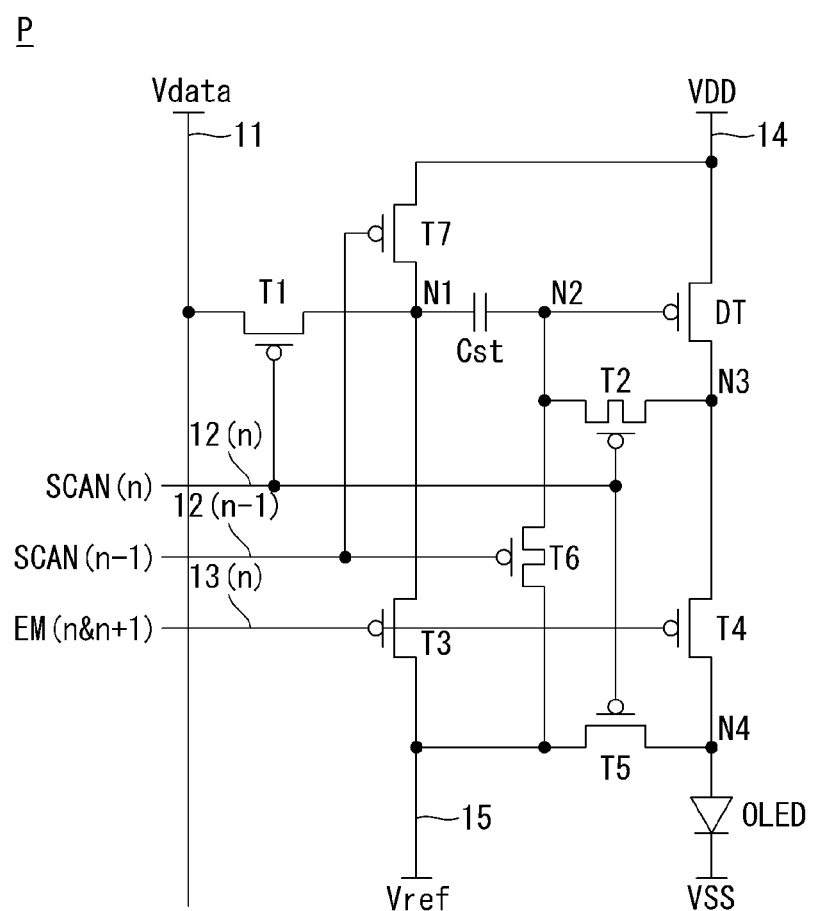
FIG. 3 is a circuit diagram of a pixel circuit according to a first embodiment of the present disclosure.
Figure 4:
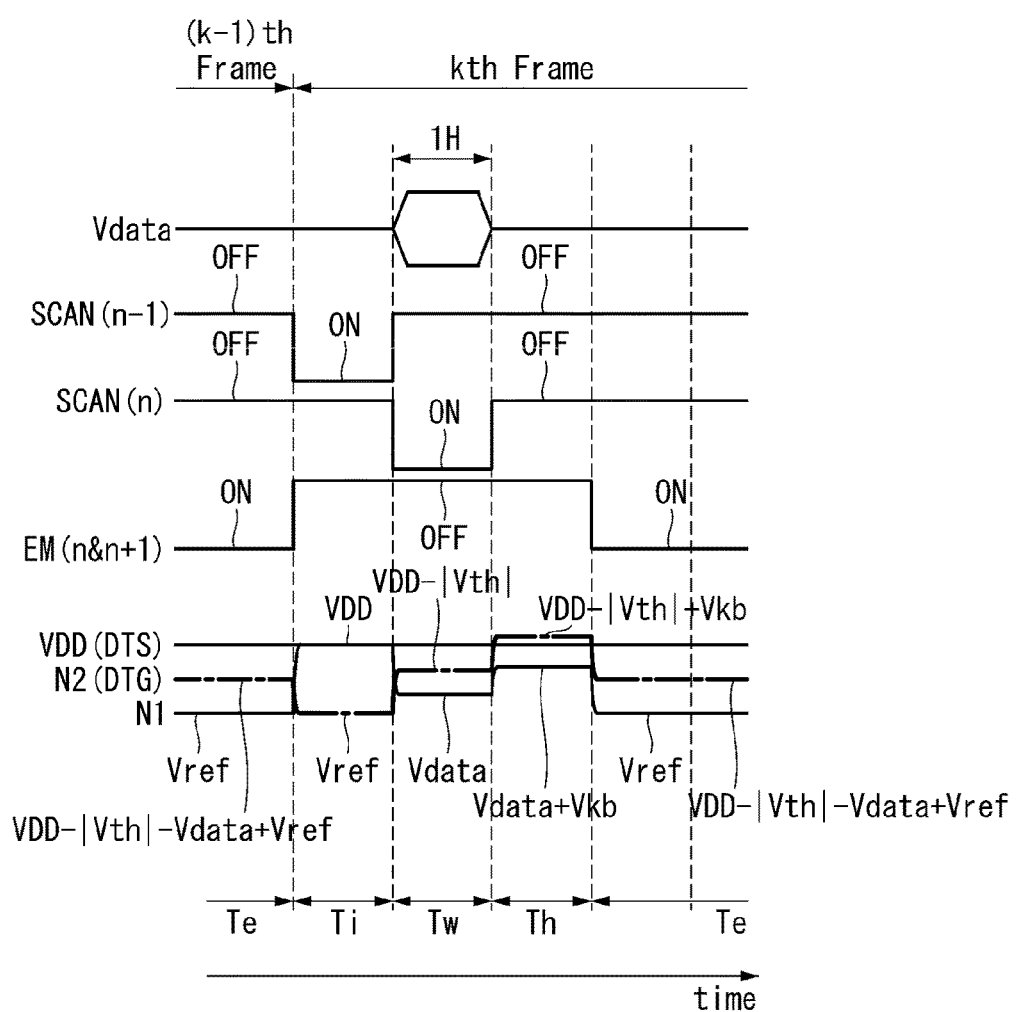
FIG. 4 is a waveform diagram showing an operation of the pixel circuit of FIG. 3.

FIG. 3 is a circuit diagram of a pixel circuit according to a first embodiment of the present disclosure. FIG. 4 is a waveform diagram showing an operation of the pixel circuit of FIG. 3. The pixel circuit shown in FIG. 3 is illustrated as being an nth pixel circuit that is arranged on an nth horizontal display line HL(n) in the screen display part AA and generates an electrical current corresponding to an nth data voltage Vdata.

Referring to FIGS. 3 and 4, the nth pixel circuit comprises an OLED, a plurality of TFTs, namely a driving transistor DT, a first transistor T1, a second transistor T2, a third transistor T3, a fourth transistor T4, a fifth transistor T5, a sixth transistor T6, and a seventh transistor T7, and a storage capacitor Cst. This embodiment is an example in which the TFTs are implemented as PMOS transistors. The following description will be made with reference to FIG. 1.

The nth pixel circuit comprises an internal compensation circuit that automatically compensates for the threshold voltage of the driving transistor DT, e.g. a driving TFT DT. Pixel power, such as a high-level power supply voltage VDD, a low-level power supply voltage VSS, and a reference voltage Vref, is applied to the pixel circuit. VDD may be a DC voltage of 7 to 9 V, VSS may be a DC voltage of 0 V, and Vref may be a DC voltage of 1 to 2 V, but they are not limited to these values. Also, pixel driving signals, such as an (n−1)th scan signal SCAN(n−1), an nth scan signal SCAN(n), an nth EM signal EM(n), and a data voltage Vdata, may be applied to the nth pixel circuit.

Scan signals SCAN(n−1) and SCAN(n) are supplied to scan lines 12(n−1) and 12(n) by the scan driver 103. An EM signal EM(n&n+1) is supplied to an EM signal line 13(n) by the EM driver 104. At this time, the EM signal EM(n) supplied to the nth EM signal line 13(n) may be supplied to an (n+1)th EM signal line 13(n+1) as well. The data voltage Vdata is supplied from the data driver 102 to a data line 11, and may range from 0 V to 4 V but its range is not limited thereto. The scan signals SCAN(n−1) and SCAN(n) have a pulse width of 1 horizontal period 1H, and swing between VGH and VGL. In the first embodiment, since the TFTs DT and T1 to T7 are PMOS transistors, the gate-on voltage is VGL and the gate-off voltage is VGH. VGH and VGL may be, but not limited to, 11 V and −4 V, respectively.

Referring to FIG. 4, subsequent to the (n−1)th scan signal SCAN(n−1), the nth scan signal SCAN(n−1) synchronized with an nth data voltage Vdata is supplied to the nth pixel circuit. The nth pixel circuit may be driven in discrete periods: a reset period Ti, a sampling period Tw, a holding period Th, and an emission period Te. An on-level pulse of the (n−1)th scan signal SCAN(n−1) is fed to the nth pixel circuit during the reset period Ti, and is kept at the gate-off voltage during the other periods. An on-level pulse of the (n)th scan signal SCAN(n) is fed to the nth pixel circuit during the sampling period Tw, and is kept at the gate-off voltage during the other periods. An off-level pulse of the EM signal EM(n&n+1) is generated at the gate-off voltage during approximately three horizontal periods overlapping with the (n−1)th and nth scan signals SCAN(n−1) and SCAN(n). The voltage of the EM signal EM(n&n+1) alternates (swings) between the gate-on voltage and the gate-off voltage with a preset PWM duty cycle during the emission period Te to apply a drive current to the OLED or cut it off.

The OLED emits light by an electrical current whose amount is adjusted by the driving TFT DT according to the data voltage Vdata, and delivers a brightness corresponding to the grayscale data of an input image. The higher the data voltage Vdata applied to the pixel circuit shown in FIGS. 3 and 4, the higher the source-gate voltage Vsg of the driving TFT DT, and this increases the pixel brightness. Also, as Vgs of the driving TFT becomes higher, the current in the OLED rises, thus increasing the amount of light emission from the OLED. Hence, in the pixel circuit shown in FIGS. 3 and 4, the higher the data voltage Vdata, the higher the pixel brightness, and the lower the data voltage Vdata, the lower the pixel brightness.

A current path in the OLED is switched by a fourth TFT T4 which is controlled according to the EM signal EM(n&n+1). The OLED comprises organic compound layers formed between the anode and the cathode. The organic compound layers may comprise, but not limited to, at least one of an emission layer EML, a hole injection layer HIL, a hole transport layer HTL, an electron transport layer ETL, and an electron injection layer EIL. The anode of the OLED is connected to a drain of the fourth TFT T4 via a fourth node N4, and the cathode of the OLED is connected to a VSS electrode to which the low-level power supply voltage VSS is applied.

The driving TFT DT is a driving element that adjusts the drive current flowing through the OLED according to the source-gate voltage Vsg. The driving TFT DT comprises a gate connected to a second node N2, a source connected to a power supply wire to which the high-level power supply voltage VDD is applied, and a drain connected to a third node N3. The second node N2 is a gate node DTG to which the gate of the driving TFT DT is connected. The power supply wire to which the high-level power supply voltage VDD is applied is a source node DTS to which the source of the driving TFT DT is connected.

The first TFT T1 is a switching element that supplies the data voltage Vdata to the first node N1 in response to the nth scan signal SCAN(n). The nth scan signal SCAN(n) is supplied to the nth pixel circuit through the nth scan line 12(n). The data voltage Vdata is a voltage synchronized with the nth scan signal SCAN(n). The first TFT T1 comprises a gate connected to the nth scan line 12(n), a source connected to the first node N1, and a drain connected to the data line 11.

The storage capacitor Cst is connected between the first node N1 and the second node N2.

The second TFT T2 is a switching element that allows current to flow between the second and third nodes N2 and N3 to diode-connect the driving TFT DT, in response to the nth scan signal SCAN(n). When the driving TFT DT is diode-connected, the electrical potential at the second and third nodes N2 and N3 becomes equal to "VDD-Vth". That is, when the driving TFT DT is diode-connected, the threshold voltage Vth of the driving TFT DT is sampled. The second TFT T2 comprises a gate connected to the nth scan line 12(n), a source connected to the third node N3, and a drain connected to the second node N2.

The third TFT T3 is a switching element that supplies the reference voltage Vref to the first node N1 in response to the EM signal EM(n&n+1). The EM signal EM(n&n+1) is supplied to the nth pixel circuit through the EM signal line 13(n). The third TFT T3 comprises a gate connected to the EM signal line 13(n), a source connected to the first node N1, and a drain connected to a power supply wire (or Vref wire) 15 to which the reference voltage Vref is applied.

The fourth TFT T4 is a switching element that allows current to flow between the third and fourth nodes N3 and N4 to apply a drive current generated by the driving TFT DT to the anode of the OLED, in response to the EM signal EM(n&n+1). The fourth TFT T4 comprises a gate connected to the EM signal line 13(n), a source connected to the third node N3, and a drain connected to the fourth node N4.

The fourth TFT T4 shuts off the current flow between the driving TFT DT and the OLED during the reset period Ti, sampling period Tw, and holding period Th so as to prevent the OLED from emitting light when not desired. If the OLED emits light at any other time than during the emission period Te, the black luminance may increase, thus lowering the contrast ratio. Black grayscale has the minimum grayscale value, e.g., 00000000(2), represented by pixel data. Pixel brightness may be the weakest at black. For example, when a high reference voltage Vref is required by a host system, the anode voltage of the OLED may rise during the sampling period Tw, and an electrical current may flow through the OLED, causing the OLED to emit light. Thus, to prevent the OLED from emitting light at any other time than during the emission period Te, the fourth TFT T4 shuts off the current path connected to the OLED in the reset period Ti, sampling period Tw, and holding period Th and connects the current path between the OLED and the driving TFT DT in the emission period Te, in response to the EM signal EM(n&n+1).

The fifth TFT T5 is a switching element that supplies the reference voltage Vref to the fourth node N4 in response to the nth scan signal SCAN(n). The fifth TFT T5 comprises a gate connected to the nth scan line 12(n), a source connected to the fourth node N4, and a drain connected to the power supply wire 15 to which the reference voltage Vref is applied.

The sixth TFT T6 is a switching element that supplies the reference voltage Vref to the second node N2 in response to the (n−1)th scan signal SCAN(n−1). The (n−1)th scan signal SCAN(n−1) is supplied to the nth pixel circuit through the (n−1)th scan line 12(n−1). The sixth TFT T6 comprises a gate connected to the (n−1)th scan line 12(n−1), a source connected to the second node N2, and a drain connected to the power supply wire 15 to which the reference voltage Vref is applied.

The seventh TFT T7 is a switching element that supplies the high-level power supply voltage VDD to the first node N1 in response to the (n−1)th scan signal SCAN(n−1). The seventh TFT T7 comprises a gate connected to the (n−1)th scan line 12(n−1), a source connected to a power supply wire (or VDD wire) 14 to which the high-level power supply voltage VDD is applied, and a drain connected to the first node N1.

In this case, the second and sixth TFTs T2 and T6 connected to the gate of the driving TFT DT are susceptible to leakage current because their off period is long. If there is a leakage current in the second and sixth TFTs T2 and T6, the electrical potential at the node N2, that is, the gate voltage DTG of the driving TFT DT, changes, making it difficult to achieve a desired shade of gray. In view of this, the second and sixth TFTs T2 and T6 may be dual gate transistors which have low leakage current, as shown in FIG. 3. If the second and sixth TFTs T2 and T6 are implemented as transistors with very low leakage current, for example, oxide TFTs, they may have a single-gate structure.

The nth pixel circuit resets the first and second nodes N1 and N2 by applying the high-level power supply voltage VDD to the first node N1 and the reference voltage Vref to the second node N2, in response to the on-level pulse of the (n−1)th scan signal SCAN(n−1). Subsequently, the nth pixel circuit samples the threshold voltage of the driving TFT DT by applying the data voltage Vdata to the first node N1, in response to the on-level pulse of the nth scan signal SCAN(n), and then short-circuiting the second and third nodes N2 and N3 to diode-connect the driving TFT DT, in response to the on-level pulse of the nth scan signal SCAN(n). Moreover, the nth pixel circuit keeps the anode potential of the OLED at the reference voltage Vref, which is lower than an operating point voltage of the OLED, by applying the reference voltage Vref to the fourth node N4 in response to the on-level pulse of the nth scan signal SCAN(n). Subsequently, the nth pixel circuit applies the reference voltage Vref to the first node N1, in response to the gate-on voltage subsequent to the off-level pulse of the EM signal EM(n&n+1), and allows current to flow between the third node N3 and the fourth node N4 to apply a drive current generated by the driving TFT DT to the anode of the OLED.

FIGS. 5A to 5E are views showing the nth pixel circuit's operation of FIG. 4 by stages. The operation of the nth pixel circuit will be described below in detail in conjunction with FIG. 4, FIGS. 5A to 5E, and Table 1.

TABLE 1

|  | Ti | Tw | Th | Te |
|---|---|---|---|---|
| N1 | VDD (or Vref) | Vdata | Vdata + Vkb | Vref |
| N2(DTG) | Vref | VDD-|Vth| | VDD-|Vth| + Vkb | VDD-|Vth|- Vdata + Vref |
| VDD(DTS) Vsg | VDD | VDD | VDD | VDD Vdata- Vref + |Vth| |

One frame for driving the nth pixel circuit of FIG. 4 comprises a reset period Ti in which the (n−1)th scan signal SCAN(n−1) is fed to an (n−1)th horizontal display line HL(n−1), a sampling period Tw in which the nth scan signal SCAN(n) is fed to an nth horizontal display line HL(n), an emission period Te in which the OLED emits light, and a holding period Th between the sampling period Tw and the emission period Te.

Figure 5A:
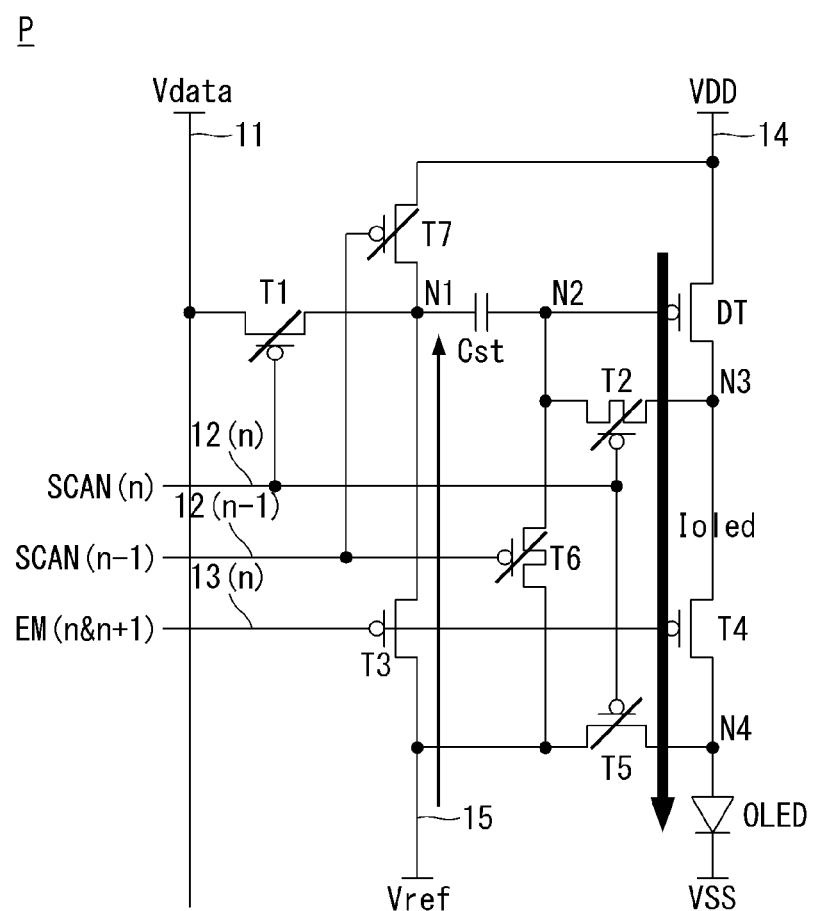
FIGS. 5A to 5E are views showing the different stages of pixel circuit's operation according to FIG. 4.

As shown in FIGS. 4 and 5A, the fourth TFT T4 turns on as the EM signal EM(n&n+1) is generated at the gate-on voltage during the emission period Te of the previous frame ((k−1)th frame). In this case, the third TFT T3 and the driving TFT DT also turn on, and the first and second TFTs T1 and T2 and the fifth to seventh TFTs T5, T6, and T7 remain turned off. Thus, drive current Ioled flows through the OLED, and the electrical potential at the first node N1 is kept at the reference voltage Vref.

Figure 5B:
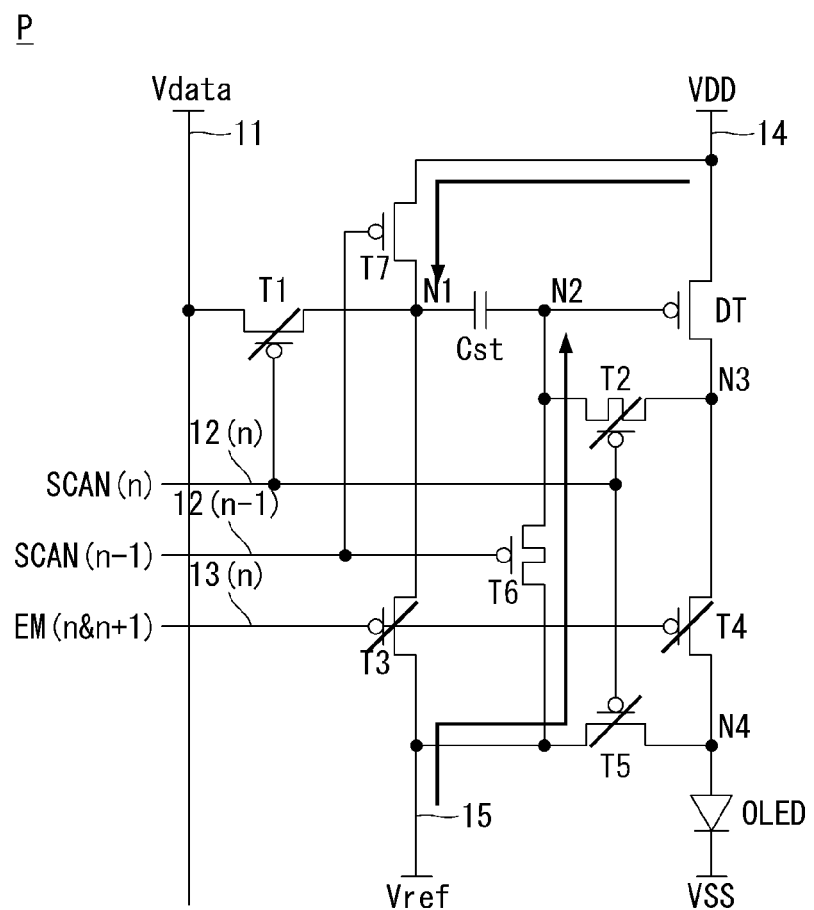

Referring to Table 1 and FIGS. 4 and 5B, when the reset period Ti of the current frame (kth frame) begins, the voltage of the (n−1)th scan signal SCAN(n−1) is inverted to the gate-on voltage, and the EM signal EM(n&n+1) is inverted to the gate-off voltage. During the reset period Ti, the nth scan signal SCAN(n) is kept at the gate-off voltage. In the reset period Ti, the sixth TFT T6 turns on in response to the on-level pulse of the (n−1)th scan signal SCAN(n−1), and the reference voltage Vref is applied to the second node N2 through the sixth TFT T6. In the reset period Ti, the seventh TFT T7 also turns on in response to the on-level pulse of the (n−1)th scan signal SCAN(n−1), and the high-level power supply voltage VDD is applied to the first node N1 through the seventh TFT T7. Thus, the voltages of the first and second nodes N1 and N2 are reset to VDD and Vref, respectively, in the reset period Ti. Apart from the sixth and seventh TFTs T6 and T7, the first to fifth TFTs T1 to T5 turn off in the reset period Ti.

Since the electrical potential at the second node N2 changes to Vref in the reset period Ti, Vsg of the driving TFT DT becomes higher than the threshold voltage Vth of the driving TFT DT and the driving TFT DT turns on.

Since the fourth TFT T4 turns off in the reset period Ti, no short-circuit occurs between VDD and Vref in the nth pixel circuit. This may minimize or reduce the problems of increased power consumption, pixel deterioration, and decreased reliability, caused by a short-circuit between VDD and Vref in the nth pixel circuit. In detail, if a short-circuit occurs between VDD and Vref in the reset period Ti due to the absence of the fourth TFT T4, this may restrict the placement of the Vref wire 15. When the Vref wire 15 is placed parallel to a vertical display line VL(n), there will no problem in resetting the gate of the driving TFT DT, whereas, when the Vref wire 15 is placed in parallel to a horizontal display line HL(n), it may be difficult to properly reset the gate of the driving TFT DT. Thus, by placing the fourth TFT T4 in the pixel circuit, short-circuit between VDD and Vref may be prevented, and the degree of freedom in the placement of the Vref wire 15 may be improved. This offers advantages in implementing a high-resolution display panel.

Figure 5C:
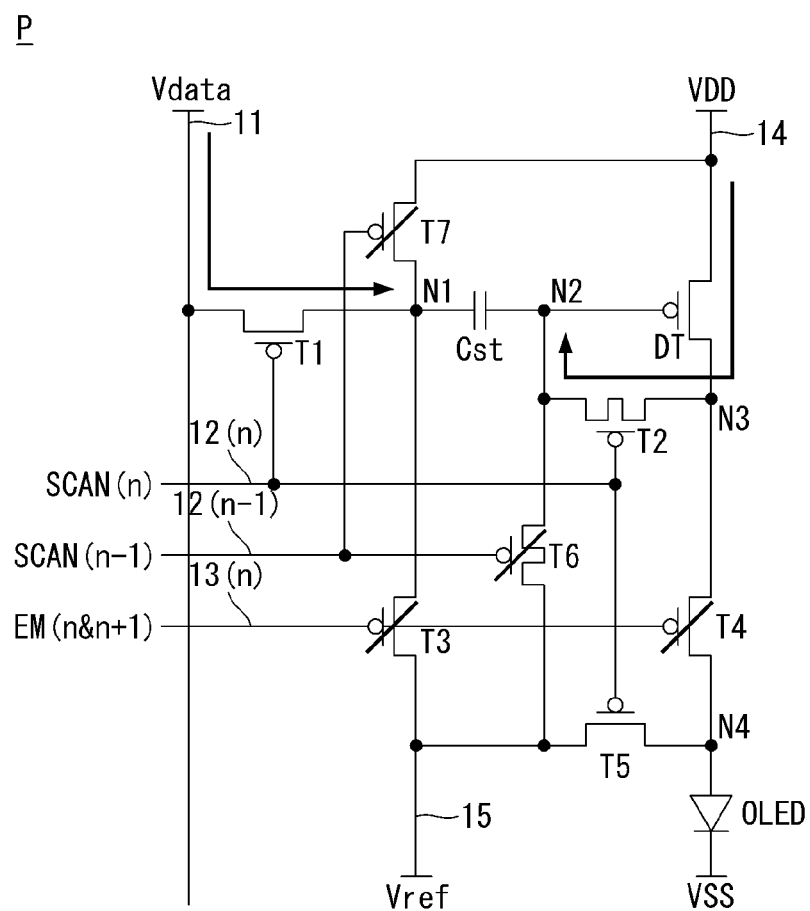

Referring to Table 1 and FIGS. 4 and 5C, when the sampling period Tw of the current frame (kth frame) begins, the voltage of the (n−1)th scan signal SCAN(n−1) is inverted to the gate-off voltage, and the voltage of the nth scan signal SCAN(n) is inverted to the gate-on voltage. During the sampling period Tw, the EM signal EM(n&n+1) is kept at the gate-off voltage.

In the sampling period Tw, the first TFT T1 turns on in response to the on-level pulse of the nth scan signal SCAN(n), and the data voltage Vdata is applied to the first node N1 through the first TFT T1. Since the data voltage Vdata is applied to the first node N1, the electrical potential at the first node N1 changes from VDD to Vdata. Vdata is applied to one electrode of the storage capacitor Cst through the first node N1.

In the sampling period Tw, the second TFT T2 turns on in response to the on-level pulse of the nth scan signal SCAN(n), and the driving TFT DT is diode-connected. When the driving TFT DT is diode-connected, the electrical potential at the second and third nodes N2 and N3 becomes equal to "VDD-Vth" due to the current flowing through the driving TFT DT. That is, when the driving TFT DT is diode-connected, the threshold voltage Vth of the driving TFT DT is sampled and applied to the other electrode of the storage capacitor Cst through the second node N2. Apart from the sixth and seventh TFTs T6 and T7, the first to fifth TFTs T1 to T5 turn off in the sampling period Tw. During the sampling period Tw, a change in the first supply voltage is reflected both at node N2 and the second electrode of the driving TFT DT.

Figure 5D:
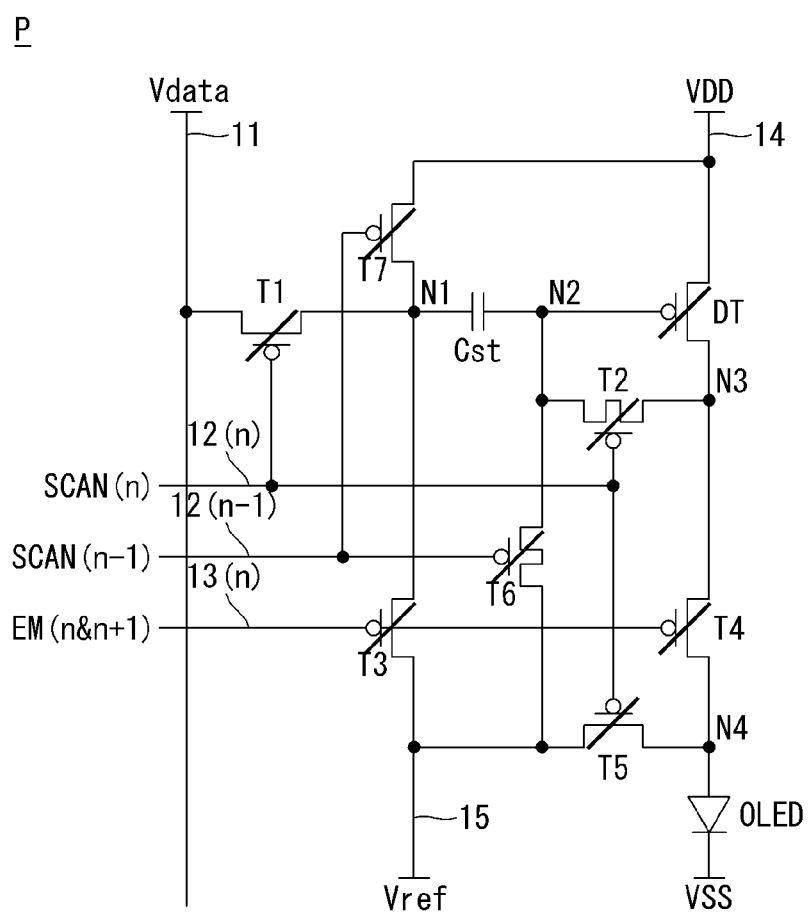

Referring to Table 1 and FIGS. 4 and 5D, when the holding period Th of the current frame (kth frame) begins, the voltage of the nth scan signal SCAN(n) is inverted to the gate-off voltage. During the holding period Th, the (n−1)th scan signal SCAN(n−1) and the EM signal EM(n&n+1) are kept at the gate-off voltage.

In the holding period Th, the voltages of the first and second nodes N1 and N2 may change by the same amount as a kickback voltage Vkb, which is generated when the nth scan signal SCAN(n) changes to the gate-off voltage, that is, when the first and second TFTs T1 and T2 turn off. Thus, in the holding period Th, the voltage of the first node N1 becomes equal to "Vdata+Vkb", and the voltage of the second node N2 becomes equal to "VDD−|Vth|+Vkb". The voltages of the first and second nodes N1 and N2 are then applied to the storage capacitor Cst. In the holding period Th, the driving TFT DT also turns off due to the voltage rise at the second node N2. Also, the third to seventh TFTs T3 to T7 remain turned off.

Figure 5E:
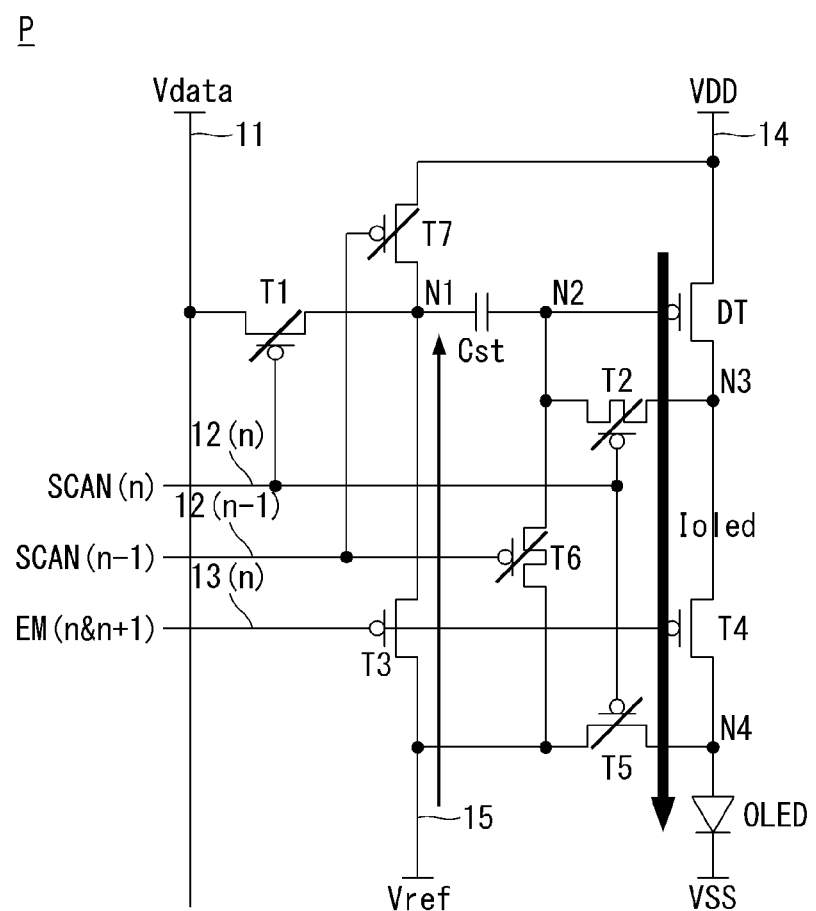

Referring to Table 1 and FIGS. 4 and 5E, when the emission period Te of the current frame (kth frame) begins, the voltage of the EM signal EM(n&n+1) is inverted to the gate-on voltage. During the emission period Te, the (n−1)th scan signal SCAN(n−1) and the nth scan signal SCAN(n) are kept at the gate-off voltage.

In the emission period Te, the third TFT T3 turns on in response to the gate-on voltage of the EM signal EM(n&n+1), and the reference voltage Vref is applied to the first node N1 through the third TFT T3.

In this case, the voltage of the first node N1 changes from "Vdata+Vkb" to Vref. The voltage of the second node N2 also changes by the same amount as the voltage change Vdata+Vkb−Vref at the first node N1, due to coupling through the storage capacitor Cst. In other words, the gate voltage DTG of the driving TFT DT, which is the voltage of the second node N2, changes from "VDD−|Vth|+Vkb" to "{VDD−|Vth|+Vkb}−{Vdata+Vkb−Vref}", that is, "VDD−|Vth|−Vdata+Vref". In this case, the source voltage DTS of the driving TFT DT is kept at VDD. Therefore, the Vsg voltage of the driving TFT DT, which determines the amount of drive current in the OLED, is set. Hereupon, the drive current Ioled represented by the following Equation 1 flows through the OLED.

$$Ioled = K(Vsg - |Vth|)^2 = K(VDD - \{VDD - |Vth| - Vdata + Vref\} - |Vth|)^2 = K(Vdata - Vref)^2 \quad [\text{Equation 1}]$$

where K is a constant which is determined by the mobility, channel width/length ratio, and parasitic capacitance of the driving TFT DT, and Vth is the threshold voltage of the driving TFT DT.

As can be seen from Equation 1, in the present disclosure, the electrical current in the OLED is not affected by VDD as a change in the first supply voltage is reflected both at node N2 and the second electrode of the driving TFT DT during an emission period of the electroluminescent display device during which the OLED emits light. In case of non-uniformity in picture quality due to a voltage drop across the VDD wire, the VDD wire may be configured in a mesh to reduce the resistance of the VDD wire. However, high-resolution display panels have their limitations when it comes to reducing the resistance of the VDD wire, because the width of the VDD wire should be reduced in order to make space for the pixels. Moreover, a display panel with a large screen size requires a longer power supply path into the screen display part AA, which will increase the resistance of the VDD wire. In the embodiment of the present disclosure, the drive current Ioled of the OLED is not affected by VDD, and therefore the brightness and color of the pixels may be uniform across the entire screen, without the VDD wire having a low-resistance design or a mesh configuration. Accordingly, the present disclosure may achieve uniform picture quality on high-resolution panels with small pixel size. Moreover, the present disclosure may provide a large-screen panel with higher brightness and picture quality. Additionally, the embodiment of the present disclosure does not require the VDD wire to be configured in a mesh since it allows for compensating for a voltage drop across the VDD wire.

Figure 6:
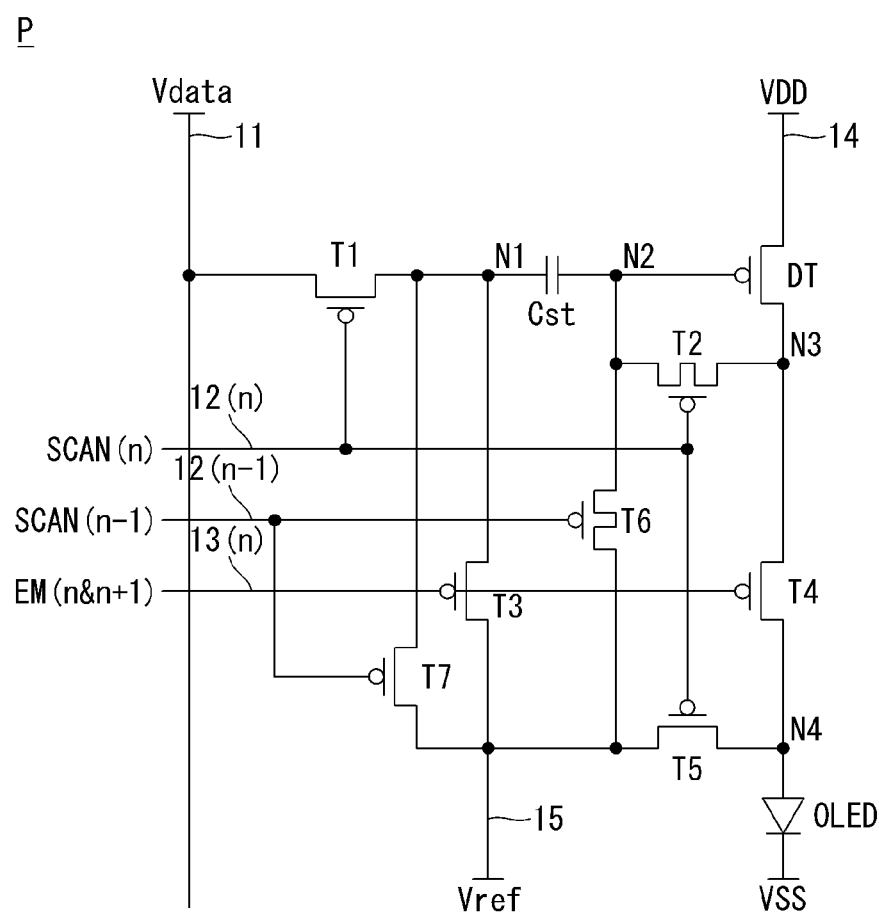
FIG. 6 is a circuit diagram of a pixel circuit according to a second embodiment of the present disclosure.
Figure 7:
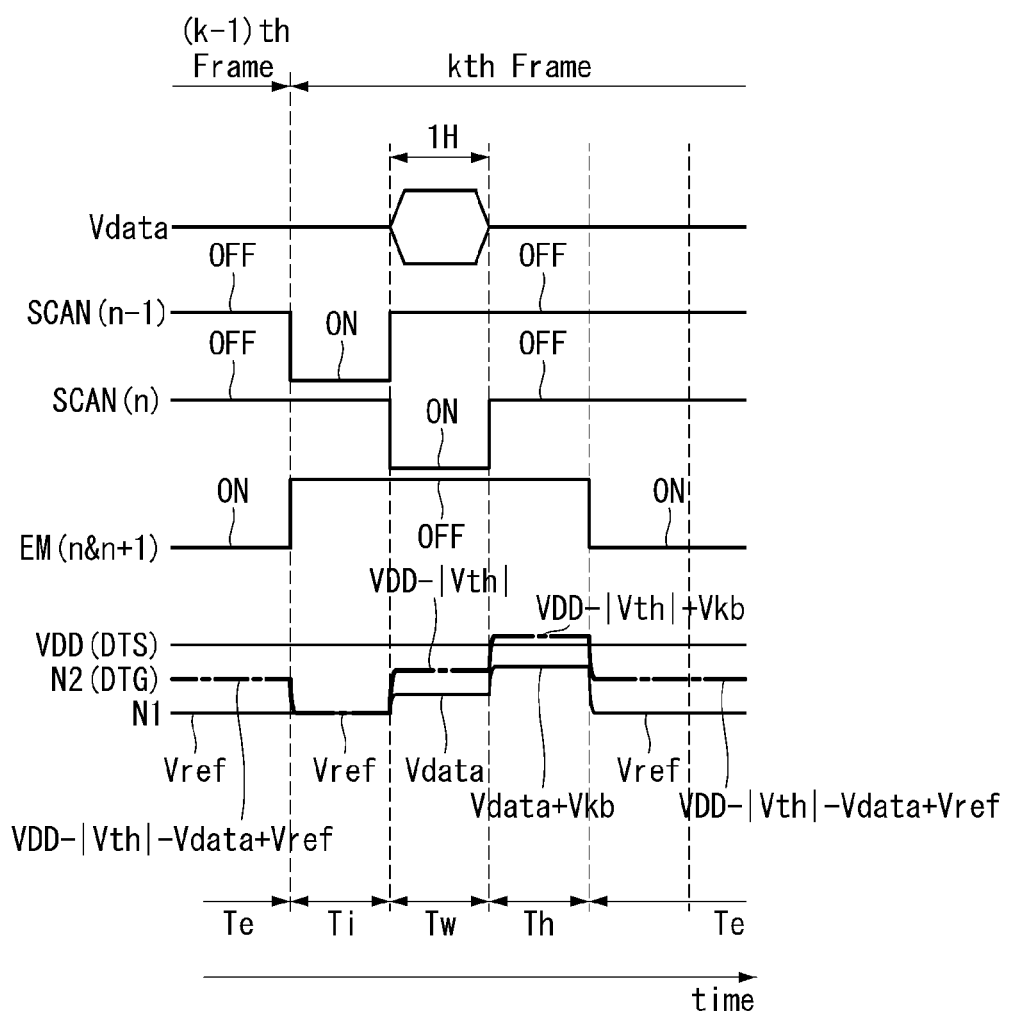
FIG. 7 is a waveform diagram showing an operation of the pixel circuit of FIG. 6.

FIG. 6 is a circuit diagram of a pixel circuit according to a second embodiment of the present disclosure. FIG. 7 is a waveform diagram showing an operation of the pixel circuit of FIG. 6.

The nth pixel circuit of FIG. 6 is substantially identical to the nth pixel circuit of FIG. 3, except for the connection configuration of the seventh TFT T7. In the second embodiment, the same components as the foregoing first embodiment will be denoted by the same reference numerals, and a detailed description of them will be omitted.

Referring to FIGS. 6 and 7, the nth pixel circuit comprises a seventh TFT T7 connected between the first node N1 and the power supply wire 15 to which the reference voltage Vref is applied. In the second embodiment, the OLED, driving TFT DT, storage capacitor Cst, and first to sixth TFTs T1 to T6 are identical to those in the foregoing first embodiment.

The seventh TFT T7 is a switching element that supplies the reference voltage Vref to the first node N1 in response to the (n−1)th scan signal SCAN(n−1). The seventh TFT T7 comprises a gate connected to the (n−1)th scan line 12(n−1), a source connected to the first node N1, and a drain connected to the power supply wire (or Vref wire) 15 to which the reference voltage Vref is applied.

The nth pixel circuit resets the first and second nodes N1 and N2 to the reference voltage Vref by applying the reference voltage Vref to the first and second nodes N1 and N2, in response to the on-level pulse of the (n−1)th scan signal SCAN(n−1). Subsequently, the nth pixel circuit samples the threshold voltage of the driving TFT DT by applying the data voltage Vdata to the first node N1, in response to the on-level pulse of the nth scan signal SCAN(n), and then short-circuiting the second and third nodes N2 and N3 to diode-connect the driving TFT DT, in response to the on-level pulse of the nth scan signal SCAN(n). Moreover, the nth pixel circuit keeps the anode potential of the OLED at the reference voltage Vref, which is lower than the operating point voltage of the OLED, by applying the reference voltage Vref to the fourth node N4 in response to the on-level pulse of the nth scan signal SCAN(n). Subsequently, the nth pixel circuit applies the reference voltage Vref to the first node N1, in response to the gate-on voltage subsequent to the off-level pulse of the EM signal EM(n&n+1), and allows current to flow between the third node N3 and the fourth node N4 to apply a drive current generated by the driving TFT DT to the anode of the OLED.

FIGS. 8A to 8E are views showing the nth pixel circuit's operation of FIG. 7 by stages. The operation of the nth pixel circuit will be described below in detail in conjunction with FIG. 7, FIGS. 8A to 8E, and Table 1.

One frame for driving the nth pixel circuit of FIG. 7 comprises a reset period Ti in which the (n−1)th scan signal SCAN(n−1) is fed to an (n−1)th horizontal display line HL(n−1), a sampling period Tw in which the nth scan signal SCAN(n) is fed to an nth horizontal display line HL(n), an emission period Te in which the OLED emits light, and a holding period Th between the sampling period Tw and the emission period Te.

Figure 8A:
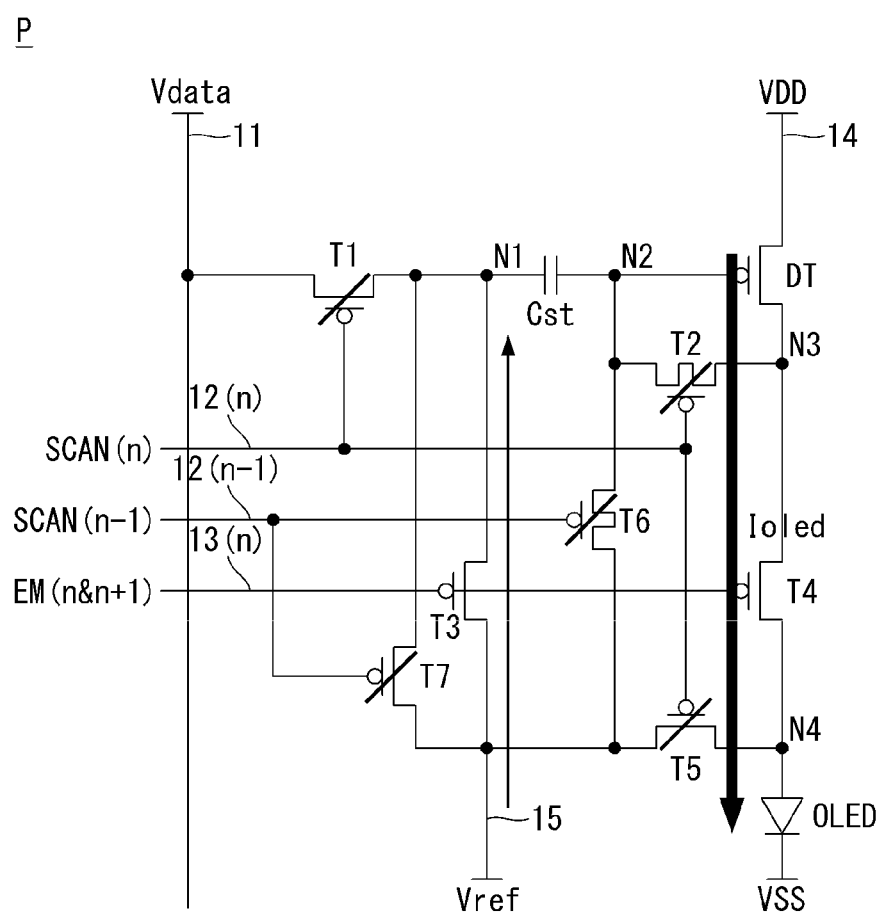
FIGS. 8A to 8E are views showing the different stages of operation of the nth pixel circuit according to FIG. 7.

As shown in FIGS. 7 and 8A, the fourth TFT T4 turns on as the EM signal EM(n&n+1) is generated at the gate-on voltage during the emission period Te of the previous frame ((k−1)th frame). In this case, the third TFT T3 and the driving TFT DT also turn on, and the first and second TFTs T1 and T2 and the fifth to seventh TFTs T5, T6, and T7 remain turned off. Thus, drive current Ioled flows through the OLED, and electrical the potential at the first node N1 is kept at the reference voltage Vref.

Figure 8B:
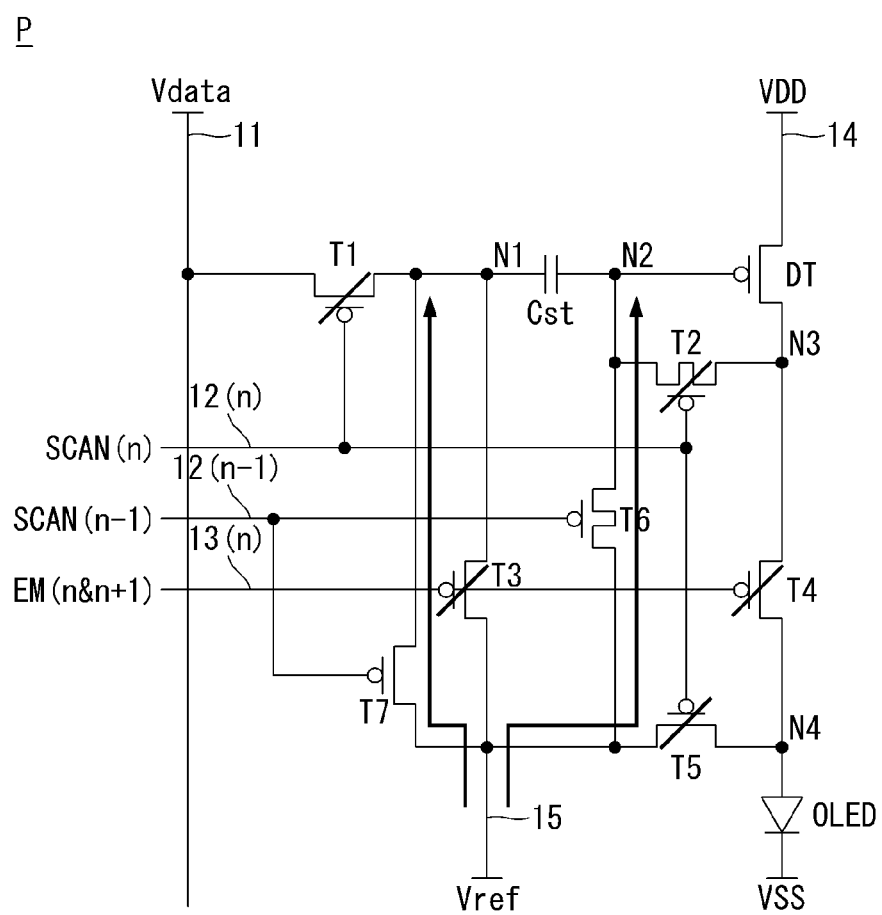

Referring to Table 1 and FIGS. 7 and 8B, when the reset period Ti of the current frame (kth frame) begins, the voltage of the (n−1)th scan signal SCAN(n−1) is inverted to the gate-on voltage, and the EM signal EM(n&n+1) is inverted to the gate-off voltage. During the reset period Ti, the nth scan signal SCAN(n) is kept at the gate-off voltage. In the reset period Ti, the sixth TFT T6 turns on in response to the on-level pulse of the (n−1)th scan signal SCAN(n−1), and the reference voltage Vref is applied to the second node N2 through the sixth TFT T6. In the reset period Ti, the seventh TFT T7 also turns on in response to the on-level pulse of the (n−1)th scan signal SCAN(n−1), and the reference voltage Vref is applied to the first node N1 through the seventh TFT T7. Thus, the voltages of the first and second nodes N1 and N2 are reset to Vref in the reset period Ti. Apart from the sixth and seventh TFTs T6 and T7, the first to fifth TFTs T1 to T5 turn off in the reset period Ti.

Since the electrical potential at the second node N2 changes to Vref in the reset period Ti, Vsg of the driving TFT DT becomes higher than the threshold voltage Vth of the driving TFT DT and the driving TFT DT turns on.

Since the fourth TFT T4 turns off in the reset period Ti, no short-circuit occurs between VDD and Vref in the nth pixel circuit. This may avoid the problems of increased power consumption, pixel deterioration, and decreased reliability, caused by a short-circuit between VDD and Vref in the nth pixel circuit.

In detail, if a short-circuit occurs between VDD and Vref in the reset period Ti due to the absence of the fourth TFT T4, this may restrict the placement of the Vref wire 15. When the Vref wire 15 is placed parallel to a vertical display line VL(n), there will no problem in resetting the gate of the driving TFT DT, whereas, when the Vref wire 15 is placed in parallel to a horizontal display line HL(n), it may be difficult to properly reset the gate of the driving TFT DT. Thus, by placing the fourth TFT T4 in the pixel circuit, short-circuit between VDD and Vref may be prevented, and the degree of freedom in the placement of the Vref wire 15 may be improved. This offers advantages in implementing a high-resolution display panel.

Figure 8C:
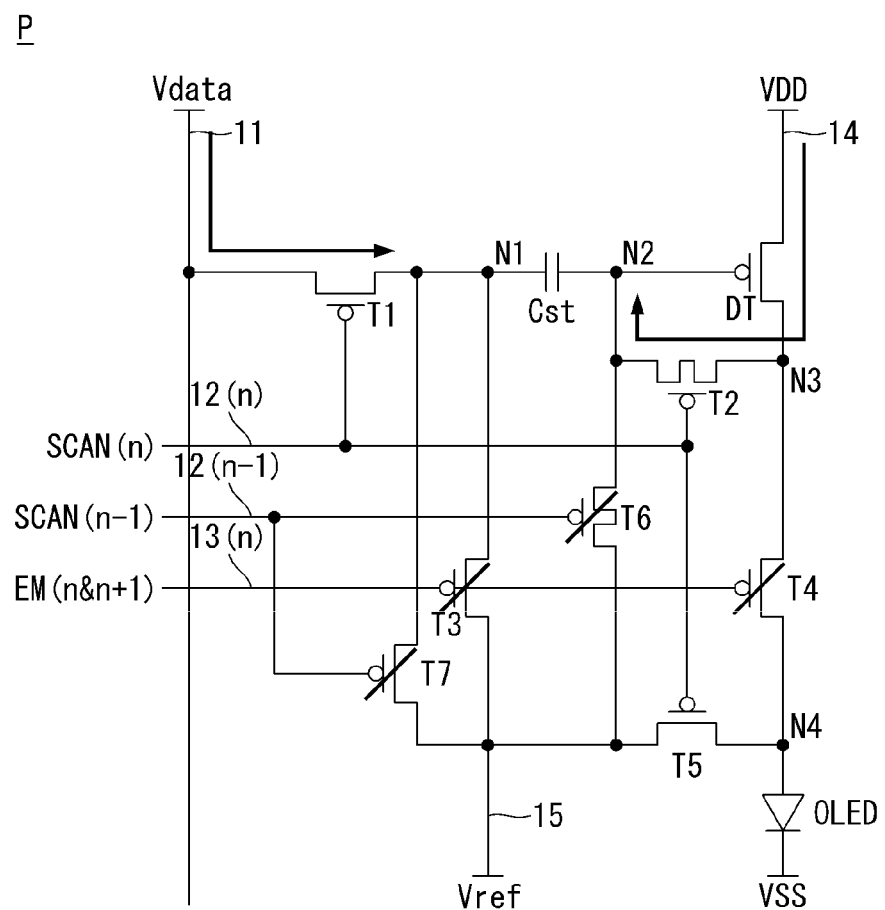

Referring to Table 1 and FIGS. 7 and 8C, when the sampling period Tw of the current frame (kth frame) begins, the voltage of the (n−1)th scan signal SCAN(n−1) is inverted to the gate-off voltage, and the voltage of the nth scan signal SCAN(n) is inverted to the gate-on voltage. During the sampling period Tw, the EM signal EM(n&n+1) is kept at the gate-off voltage.

In the sampling period Tw, the first TFT T1 turns on in response to the on-level pulse of the nth scan signal SCAN(n), and the data voltage Vdata is applied to the first node N1 through the first TFT T1. Since the data voltage Vdata is applied to the first node N1, the electrical potential at the first node N1 changes from Vref to Vdata. Vdata is applied to one electrode of the storage capacitor Cst through the first node N1.

In the sampling period Tw, the second TFT T2 turns on in response to the on-level pulse of the nth scan signal SCAN(n), and the driving TFT DT is diode-connected. When the driving TFT DT is diode-connected, the electrical potential at the second and third nodes N2 and N3 becomes equal to "VDD-Vth" due to the current flowing through the driving TFT DT. That is, when the driving TFT DT is diode-connected, the threshold voltage Vth of the driving TFT DT is sampled and applied to the other electrode of the storage capacitor Cst through the second node N2. Apart from the sixth and seventh TFTs T6 and T7, the first to fifth TFTs T1 to T5 turn off in the sampling period Tw.

Figure 8D:
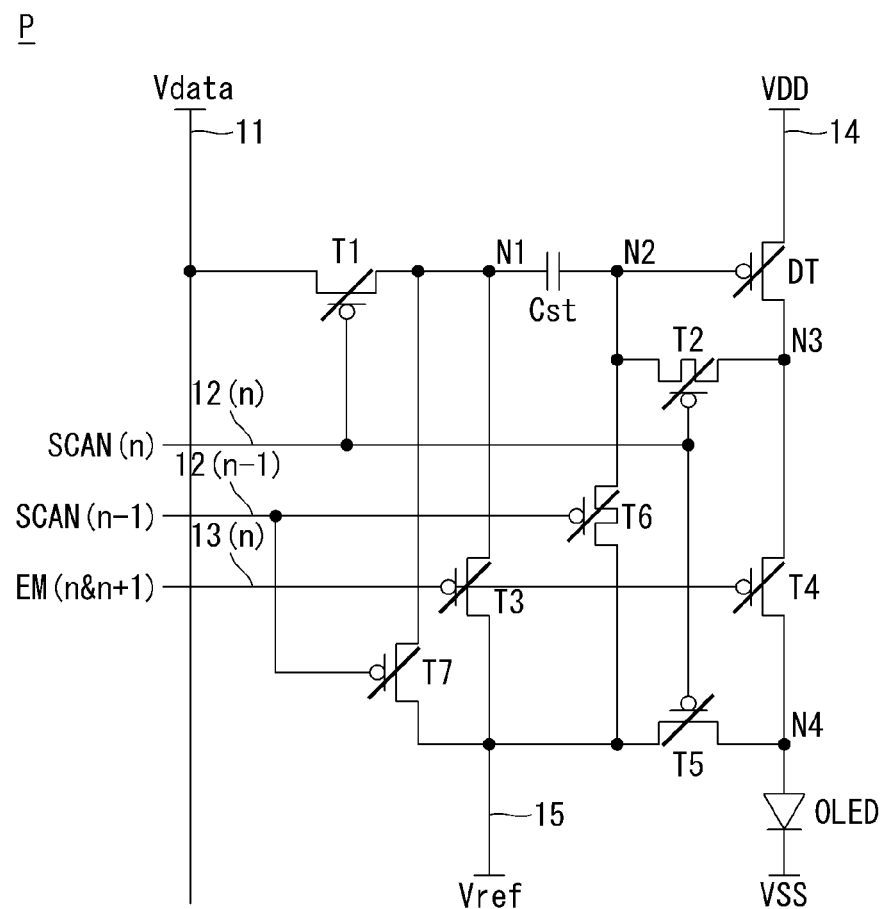

Referring to Table 1 and FIGS. 7 and 8D, when the holding period Th of the current frame (kth frame) begins, the voltage of the nth scan signal SCAN(n) is inverted to the gate-off voltage. During the holding period Th, the (n−1)th scan signal SCAN(n−1) and the EM signal EM(n&n+1) are kept at the gate-off voltage.

In the holding period Th, the voltages of the first and second nodes N1 and N2 may change by the same amount as a kickback voltage Vkb, which is generated when the nth scan signal SCAN(n) changes to the gate-off voltage, that is, when the first and second TFTs T1 and T2 turn off. Thus, in the holding period Th, the voltage of the first node N1 becomes equal to "Vdata+Vkb", and the voltage of the second node N2 becomes equal to "VDD−|Vth|+Vkb". The voltages of the first and second nodes N1 and N2 are then applied to the storage capacitor Cst. In the holding period Th, the driving TFT DT also turns off due to the voltage rise at the second node N2. Also, the third to seventh TFTs T3 to T7 remain turned off.

Figure 8E:
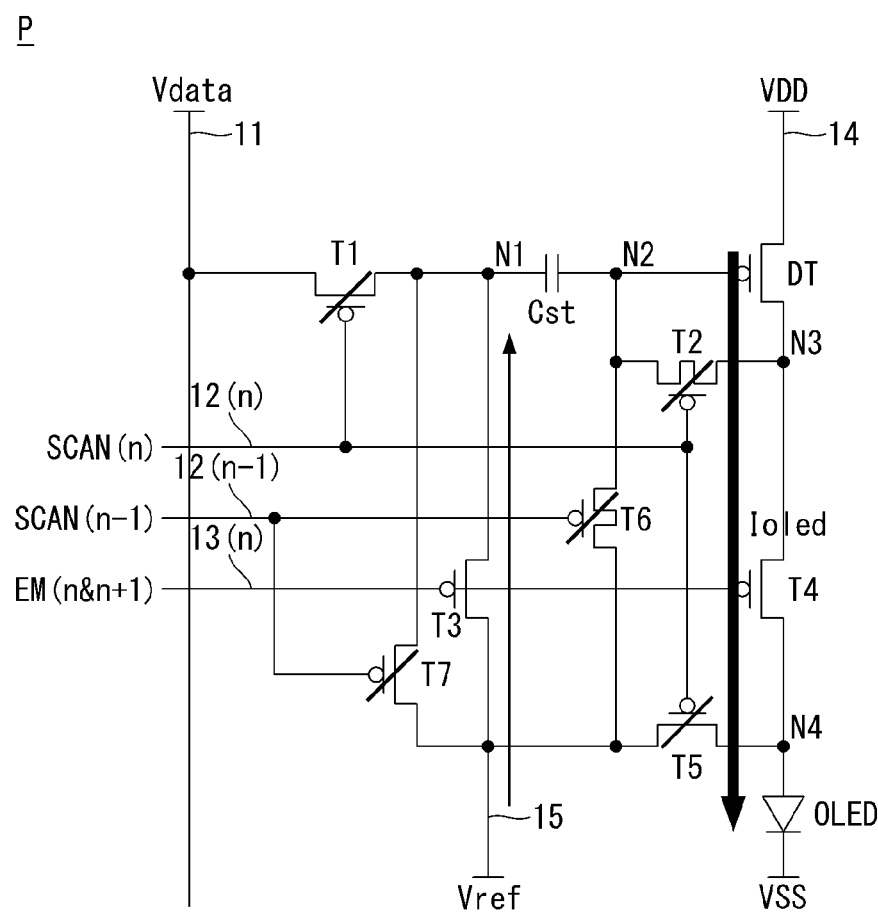

Referring to Table 1 and FIGS. 7 and 8E, when the emission period Te of the current frame (kth frame) begins, the voltage of the EM signal EM(n&n+1) is inverted to the gate-on voltage. During the emission period Te, the (n−1)th scan signal SCAN(n−1) and the nth scan signal SCAN(n) are kept at the gate-off voltage.

In the emission period Te, the third TFT T3 turns on in response to the gate-on voltage of the EM signal EM(n&n+1), and the reference voltage Vref is applied to the first node N1 through the third TFT T3.

In this case, the voltage of the first node N1 changes from "Vdata+Vkb" to Vref. The voltage of the second node N2 also changes by the same amount as the voltage change Vdata+Vkb−Vref at the first node N1, due to coupling through the storage capacitor Cst. In other words, the gate voltage DTG of the driving TFT DT, which is the voltage of the second node N2, changes from "VDD−|Vth|+Vkb" to "{VDD−|Vth|+Vkb}−{Vdata+Vkb−Vref}", that is, "VDD−|Vth|−Vdata+Vref". In this case, the source voltage DTS of the driving TFT DT is kept at VDD. Therefore, the Vsg voltage of the driving TFT DT, which determines the amount of drive current in the OLED, is set. Hereupon, the drive current Ioled represented by the above Equation 1 flows through the OLED.

As can be seen from Equation 1, in the present disclosure, the electrical current in the OLED is not affected by VDD. In case of non-uniformity in picture quality due to a voltage drop across the VDD wire, the VDD wire may be configured in a mesh to reduce the resistance of the VDD wire. However, high-resolution display panels have their limitations when it comes to reducing the resistance of the VDD wire, because the width of the VDD line should be reduced in order to make space for the pixels. Moreover, a display panel with a large screen size requires a longer power supply path into the screen display part AA, which will increase the resistance of the VDD wire. In the embodiment of the present disclosure, the drive current Ioled of the OLED is not affected by VDD, and therefore the brightness and color of the pixels may be uniform across the entire screen, without the VDD wire having a low-resistance design or a mesh configuration. Accordingly, the present disclosure may achieve uniform picture quality on high-resolution panels with small pixel size. Moreover, the present disclosure may provide a large-screen panel with higher brightness and picture quality. Additionally, the embodiment of the present disclosure does not require the VDD wire to be configured in a mesh since it allows for compensating for a voltage drop across the VDD wire.

Figure 9:
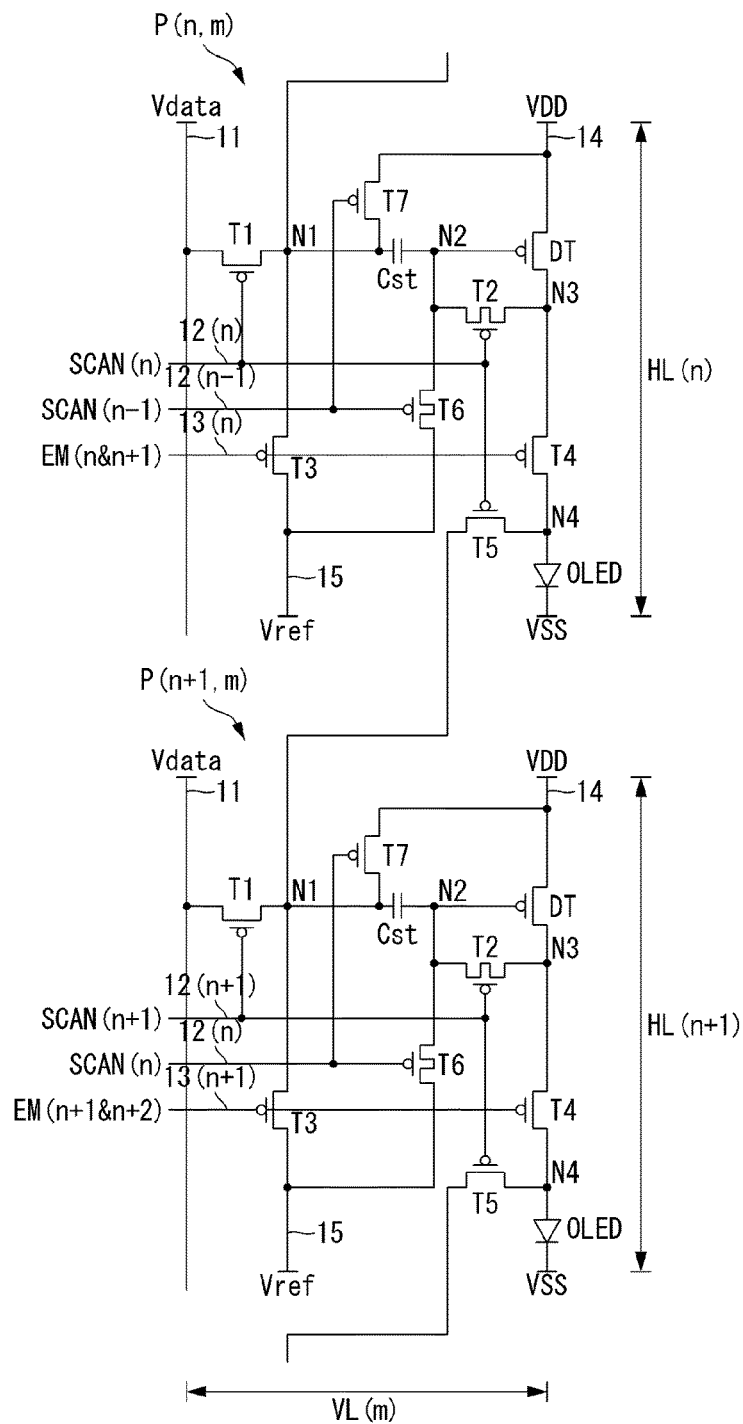
FIG. 9 is a circuit diagram of a pixel circuit according to a third embodiment of the present disclosure, which shows one modified embodiment of the connection configuration of the fifth TFT in the nth pixel circuit of FIG. 3.

FIG. 9 is a circuit diagram of a pixel circuit according to a third embodiment of the present disclosure, which shows one modified embodiment of the connection configuration of the fifth TFT in the nth pixel circuit of FIG. 3.

The pixel circuit of FIG. 9 is substantially identical to the nth pixel circuit of FIG. 3, except for the connection configuration of the fifth TFT T5. In the third embodiment, the same components as the foregoing first and second embodiments will be denoted by the same reference numerals, and a detailed description of them will be omitted.

Referring to FIG. 9, the pixel circuit will apply with respect to a first pixel P(n,m) (n and m are positive integers) and a second pixel P(n+1,m).

In a case where the first pixel P(n,m) is located on an nth horizontal display line HL(n) and an mth vertical display line VL(m) and the second pixel P(n+1,m) is located on an (n+1)th horizontal display line HL(n+1) and the mth vertical display line VL(m), the fifth TFT T5 of the first pixel P(n,m) is connected between a fourth node N4 of the first pixel P(n,m) and a first node N1 of the second pixel P(n+1,m). In this embodiment, the OLED, driving TFT DT, storage capacitor Cst, and first to fourth and sixth and seventh TFTs T1 to T4 and T6 and T7 are identical to those in the foregoing first embodiment.

The fifth TFT T5 of the first pixel P(n,m) is a switching element that supplies the reference voltage Vref stored in the first node N1 of the second pixel P(n+1,m) to the fourth node N4 of the first pixel P(n,m) as it turns on in response to the nth scan signal SCAN(n). The fifth TFT T5 of the first pixel P(n,m) comprises a gate connected to the nth scan line 12(*n*), a source connected to the fourth node N4 of the first pixel P(n,m), and a drain connected to the first node N1 of the second pixel P(n+1,m).

The fifth TFT T5 of the first pixel P(n,m) is different from that of FIG. 3 in that it is not directly connected to Vref but instead connected to the first node N1 of the second pixel P(n+1,m). Since Vref is applied to the first node N1 of the second pixel P(n+1,m), the same effect may be achieved by connecting the fifth TFT T5 of the first pixel P(n,m) to the first node N1 of the second pixel P(n+1,m), rather than connecting it directly to Vref. The reason why the fifth TFT T5 is not connected directly to Vref but connected to a neighboring pixel is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 3, the third TFT T3, fifth TFT T5, and sixth TFT T6 are commonly connected to Vref. In order to do this, the power supply contact hole should be designed in a large size, or the number of power supply contact holes should be increased. However, as shown in FIG. 9, if the fifth TFT T5 is connected from the first node N1 of the neighboring pixel P(n+1,m) to one electrode of the first TFT T1, third TFT T3, and seventh TFT T7, rather than being connected directly to Vref, then it means one less TFT to connect to the power supply contact hole. That is to say, the smaller the number of TFTs, the broader the choice of power supply contact hole designs.

Figure 10:
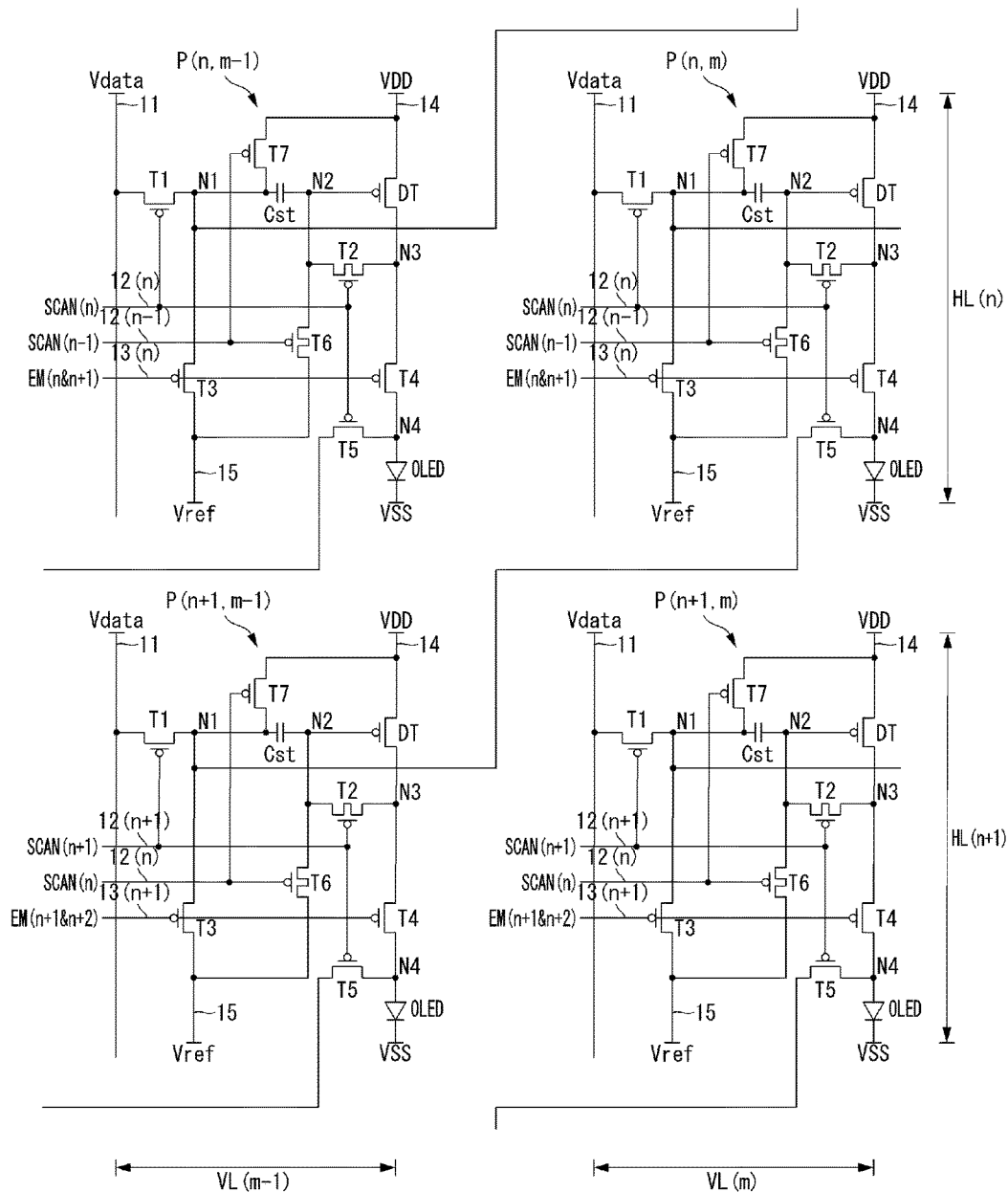
FIG. 10 is a circuit diagram of a pixel circuit according to a fourth embodiment of the present disclosure, which shows another modified embodiment of the connection configuration of the fifth TFT in the nth pixel circuit of FIG. 3.

FIG. 10 is a circuit diagram of a pixel circuit according to a fourth embodiment of the present disclosure, which shows another modified embodiment of the connection configuration of the fifth TFT in the nth pixel circuit of FIG. 3.

The pixel circuit of FIG. 10 is substantially identical to the nth pixel circuit of FIG. 3, except for the connection configuration of the fifth TFT T5. In the fourth embodiment, the same components as the foregoing first to third embodiments will be denoted by the same reference numerals, and a detailed description of them will be omitted.

Referring to FIG. 10, the pixel circuit will apply with respect to a first pixel P(n,m) (n and m are positive integers) and a second pixel P(n+1,m−1).

In a case where the first pixel P(n,m) is located on an nth horizontal display line HL(n) and an mth vertical display line VL(m) and the second pixel P(n+1,m−1) is located on an (n+1)th horizontal display line HL(n+1) and an (m−1)th vertical display line VL(m−1), the fifth TFT T5 of the first pixel P(n,m) is connected between a fourth node N4 of the first pixel P(n,m) and a first node N1 of the second pixel P(n+1,m−1). In the fourth embodiment, the OLED, driving TFT DT, storage capacitor Cst, and first to fourth and sixth and seventh TFTs T1 to T4 and T6 and T7 are identical to those in the foregoing first embodiment.

The fifth TFT T5 of the first pixel P(n,m) is a switching element that supplies the reference voltage Vref stored in the first node N1 of the second pixel P(n+1,m−1) to the fourth node N4 of the first pixel P(n,m) as it turns on in response to the nth scan signal SCAN(n). The fifth TFT T5 of the first pixel P(n,m) comprises a gate connected to the nth scan line 12(*n*), a source connected to the fourth node N4 of the first pixel P(n,m), and a drain connected to the first node N1 of the second pixel P(n+1,m−1).

The fifth TFT T5 of the first pixel P(n,m) is different from that of FIG. 3 in that it is not directly connected to Vref but instead connected to the first node N1 of the second pixel P(n+1,m−1). Since Vref is applied to the first node N1 of the second pixel P(n+1,m−1), the same effect may be achieved by connecting the fifth TFT T5 of the first pixel P(n,m) to the first node N1 of the second pixel P(n+1,m−1), rather than connecting it directly to Vref. The reason why the fifth TFT T5 is not connected directly to Vref but connected to a neighboring pixel is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 3, the third TFT T3, fifth TFT T5, and sixth TFT T6 are commonly connected to Vref. In order to do this, the power supply contact hole should be designed in a large size, or the number of power supply contact holes should be increased. However, as shown in FIG. 10, if the fifth TFT T5 is connected from the first node N1 of the neighboring pixel P(n+1,m−1) to one electrode of the first TFT T1, third TFT T3, and seventh TFT T7, rather than being connected directly to Vref, then it means one less TFT to connect to the power supply contact hole. That is to say, the smaller the number of TFTs, the broader the choice of power supply contact hole designs.

Figure 11:
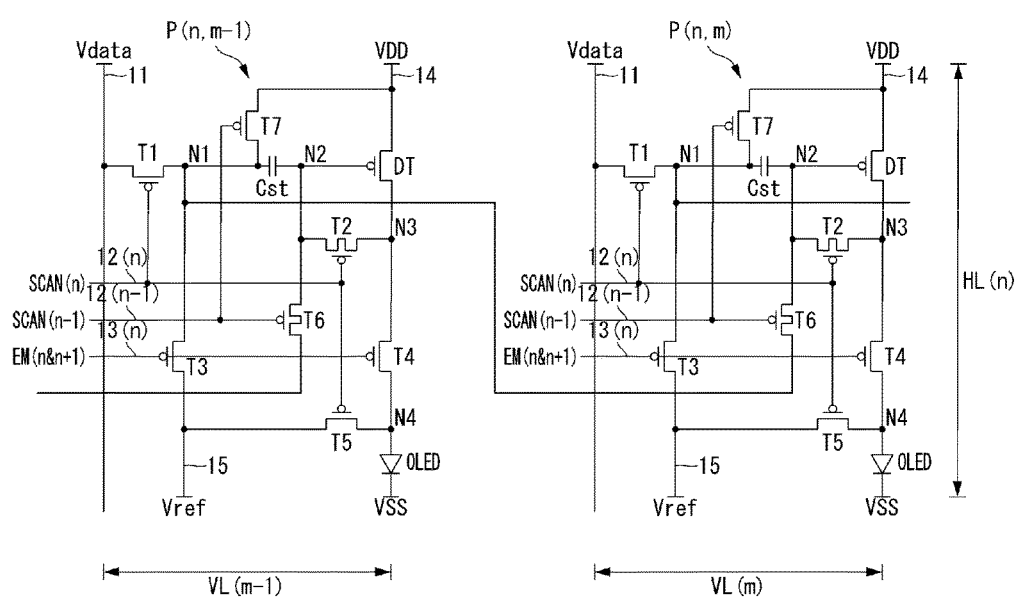
FIG. 11 is a circuit diagram of a pixel circuit according to a fifth embodiment of the present disclosure, which shows one modified embodiment of the connection configuration of the sixth TFT in the nth pixel circuit of FIG. 3.

FIG. 11 is a circuit diagram of a pixel circuit according to a fifth embodiment of the present disclosure, which shows one modified embodiment of the connection configuration of the sixth TFT in the nth pixel circuit of FIG. 3.

The pixel circuit of FIG. 11 is substantially identical to the nth pixel circuit of FIG. 3, except for the connection configuration of the sixth FT T6. In the fifth embodiment, the same components as the foregoing first to fourth embodiments will be denoted by the same reference numerals, and a detailed description of them will be omitted.

Referring to FIG. 11, the pixel circuit will apply with respect to a first pixel P(n,m) (n and m are positive integers) and a second pixel P(n,m−1).

In a case where the first pixel P(n,m) is located on an nth horizontal display line HL(n) and an mth vertical display line VL(m) and the second pixel P(n,m−1) is located on an nth horizontal display line HL(n) and an (m−1)th vertical display line VL(m−1), the sixth TFT T6 of the first pixel P(n,m) is connected between a second node N2 of the first pixel P(n,m) and a first node N1 of the second pixel P(n,m−1). In the fifth embodiment, the OLED, driving TFT DT, storage capacitor Cst, and first to fifth and seventh TFTs T1 to T5 and T7 are identical to those in the foregoing first embodiment.

The sixth TFT T6 of the first pixel P(n,m) is a switching element that supplies the reference voltage Vref stored in the first node N1 of the second pixel P(n,m−1) to the second node N2 of the first pixel P(n,m) as it turns on in response to the (n−1)th scan signal SCAN(n−1). The sixth TFT T6 of the first pixel P(n,m) comprises a gate connected to the (n−1)th scan line 12(n−1), a source connected to the second node N2 of the first pixel P(n,m), and a drain connected to the first node N1 of the second pixel P(n,m−1).

The sixth TFT T6 of the first pixel P(n,m) is different from that of FIG. 3 in that it is not directly connected to Vref but instead connected to the first node N1 of the second pixel P(n,m−1). Since Vref is applied to the first node N1 of the second pixel P(n,m−1), the same effect may be achieved by connecting the sixth TFT T6 of the first pixel P(n,m) to the first node N1 of the second pixel P(n,m−1), rather than connecting it directly to Vref. The reason why the sixth TFT T6 is not connected directly to Vref but connected to a neighboring pixel is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 3, the third TFT T3, fifth TFT T5, and sixth TFT T6 are commonly connected to Vref. In order to do this, the power supply contact hole should be designed in a large size, or the number of power supply contact holes should be increased. However, as shown in FIG. 11, if the sixth TFT T6 is connected from the first node N1 of the neighboring pixel P(n,m−1) to one electrode of the first TFT T1, third TFT T3, and seventh TFT T7, rather than being connected directly to Vref, then it means one less TFT to connect to the power supply contact hole. That is to say, the smaller the number of TFTs, the broader the choice of power supply contact hole designs.

Figure 12:
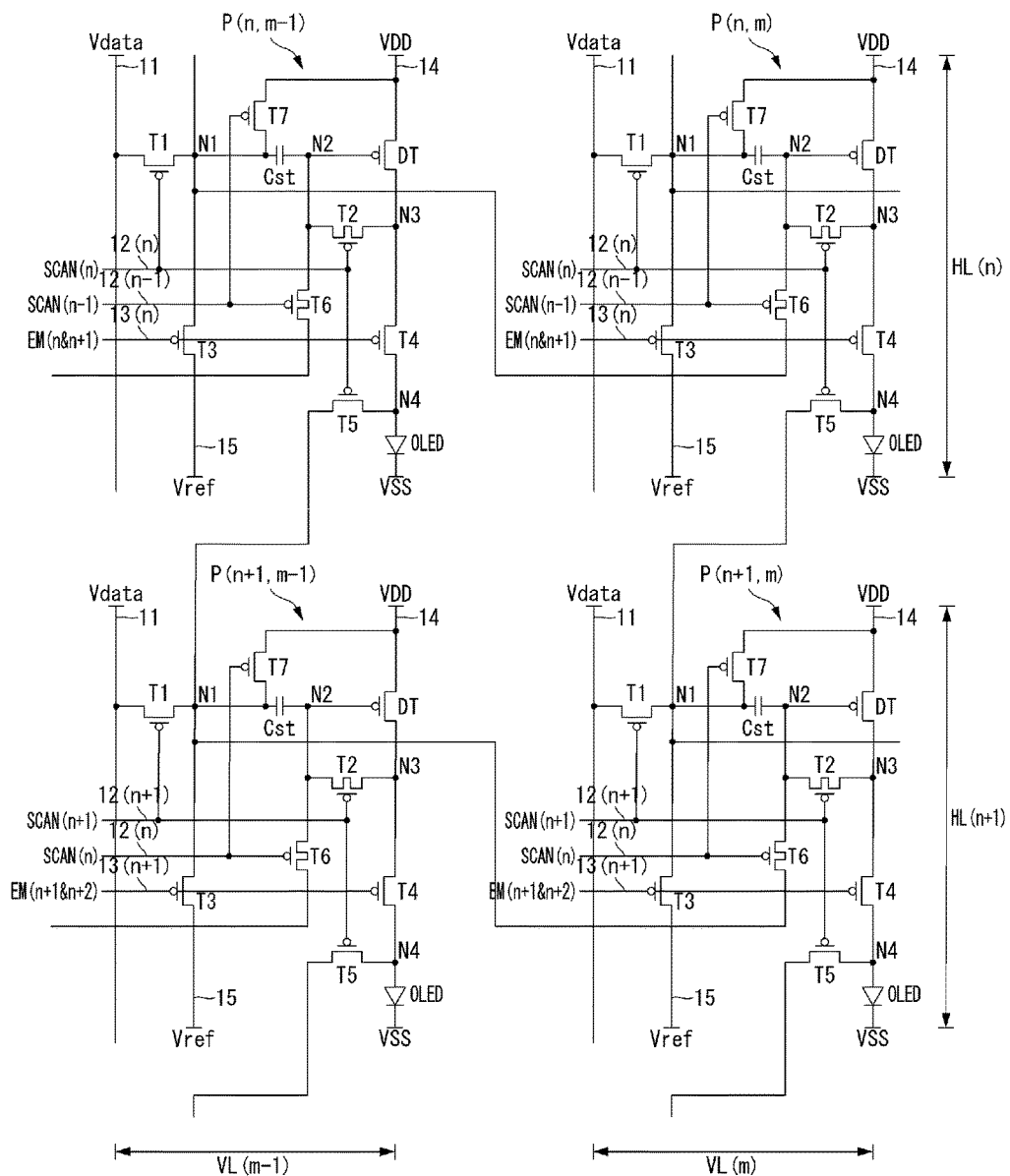
FIG. 12 is a circuit diagram of a pixel circuit according to a sixth embodiment of the present disclosure, which shows one modified embodiment of the connection configuration of the fifth and sixth TFTs in the nth pixel circuit of FIG. 3.

FIG. 12 is a circuit diagram of a pixel circuit according to a sixth embodiment of the present disclosure, which shows one modified embodiment of the connection configuration of the fifth and sixth TFTs in the nth pixel circuit of FIG. 3.

The pixel circuit of FIG. 12 is substantially identical to the nth pixel circuit of FIG. 3, except for the connection configuration of the fifth and sixth TFTs T5 and T6. In the sixth embodiment, the same components as the foregoing first to fifth embodiments will be denoted by the same reference numerals, and a detailed description of them will be omitted.

Referring to FIG. 12, the pixel circuit will apply with respect to a first pixel P(n,m) (n and m are positive integers), a second pixel P(n+1,m), and a third pixel P(n,m−1).

In a case where the first pixel P(n,m) is located on an nth horizontal display line HL(n) and an mth vertical display line VL(m), the second pixel P(n+1,m) is located on an (n+1)th horizontal display line HL(n+1) and the mth vertical display line VL(m), and the third pixel P(n,m−1) is located on the nth horizontal display line HL(N) and an (m−1)th vertical display line VL(m−1), the fifth TFT T5 of the first pixel P(n,m) is connected between a fourth node N4 of the first pixel P(n,m) and a first node N1 of the second pixel P(n+1,m). The sixth TFT T6 of the first pixel P(n,m) is connected between a second node N2 of the first pixel P(n,m) and a first node N1 of the third pixel P(n,m−1). In the sixth embodiment, the OLED, driving TFT DT, storage capacitor Cst, and first to fourth and seventh TFTs T1 to T4 and T7 are identical to those in the foregoing first embodiment.

The fifth TFT T5 of the first pixel P(n,m) is a switching element that supplies the reference voltage Vref stored in the first node N1 of the second pixel P(n+1,m) to the fourth node N4 of the first pixel P(n,m) as it turns on in response to the nth scan signal SCAN(n). The fifth TFT T5 of the first pixel P(n,m) comprises a gate connected to the nth scan line 12(n), a source connected to the fourth node N4 of the first pixel P(n,m), and a drain connected to the first node N1 of the second pixel P(n+1,m).

The sixth TFT T6 of the first pixel P(n,m) is a switching element that supplies the reference voltage Vref stored in the first node N1 of the third pixel P(n,m−1) to the second node N2 of the first pixel P(n,m) as it turns on in response to the (n−1)th scan signal SCAN(n−1). The sixth TFT T6 of the first pixel P(n,m) comprises a gate connected to the (n−1)th scan line 12(n−1), a source connected to the second node N2 of the first pixel P(n,m), and a drain connected to the first node N1 of the third pixel P(n,m−1).

The fifth TFT T5 of the first pixel P(n,m) is different from that of FIG. 3 in that it is not directly connected to Vref but instead connected to the first node N1 of the second pixel P(n+1,m). Since Vref is applied to the first node N1 of the second pixel P(n+1,m), the same effect may be achieved by connecting the fifth TFT T5 of the first pixel P(n,m) to the first node N1 of the second pixel P(n+1,m), rather than connecting it directly to Vref.

The sixth TFT T6 of the first pixel P(n,m) is different from that of FIG. 3 in that it is not directly connected to Vref but instead connected to the first node N1 of the third pixel P(n,m−1). Since Vref is applied to the first node N1 of the third pixel P(n,m−1), the same effect may be achieved by connecting the sixth TFT T6 of the first pixel P(n,m) to the first node N1 of the third pixel P(n,m−1), rather than connecting it directly to Vref.

The reason why the fifth and sixth TFTs T5 and T6 are not connected directly to Vref but connected to neighboring pixels is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 3, the third TFT T3, fifth TFT T5, and sixth TFT T6 are commonly connected to Vref. In order to do this, the power supply contact hole should be designed in a large size, or the number of power supply contact holes should be increased. However, as shown in FIG. 12, if the fifth and sixth TFTs T5 and T6 are connected from the first nodes N1 of the neighboring pixels P(n+1,m) and P(n,m−1) to one electrode of the first TFT T1, third TFT T3, and seventh TFT T7, rather than being connected directly to Vref, then it means two less TFTs to connect to the power supply contact hole. That is to say, the smaller the number of TFTs, the broader the choice of power supply contact hole designs.

Figure 13:
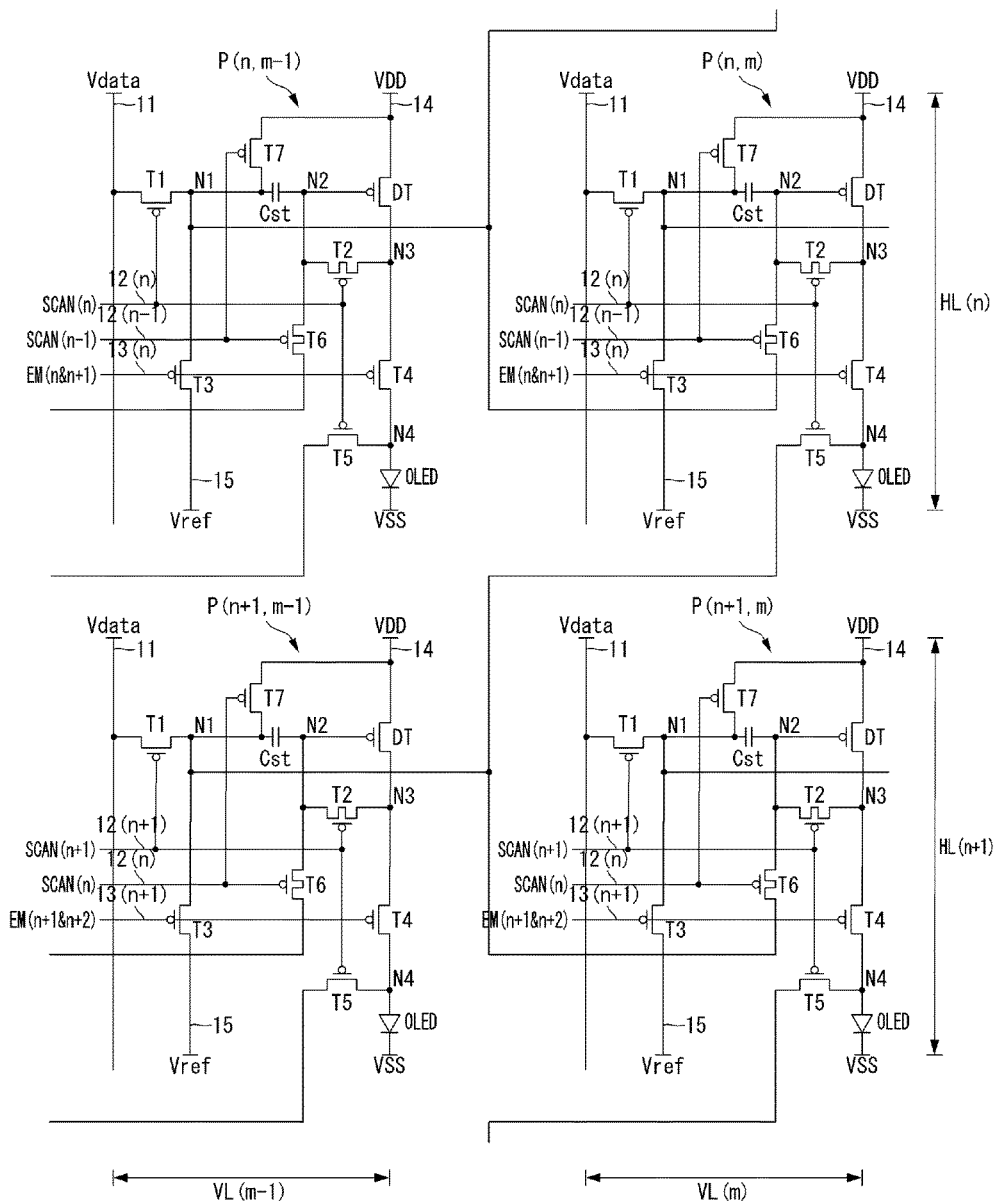
FIG. 13 is a circuit diagram of a pixel circuit according to a seventh embodiment of the present disclosure, which shows another modified embodiment of the connection configuration of the fifth and sixth TFTs in the nth pixel circuit of FIG. 3.

FIG. 13 is a circuit diagram of a pixel circuit according to a seventh embodiment of the present disclosure, which shows another modified embodiment of the connection configuration of the fifth and sixth TFTs in the nth pixel circuit of FIG. 3.

The pixel circuit of FIG. 13 is substantially identical to the nth pixel circuit of FIG. 3, except for the connection configuration of the fifth and sixth TFTs T5 and T6. In the seventh embodiment, the same components as the foregoing first to sixth embodiments will be denoted by the same reference numerals, and a detailed description of them will be omitted.

Referring to FIG. 13, the pixel circuit will apply with respect to a first pixel P(n,m) (n and m are positive integers), a second pixel P(n+1,m−1), and a third pixel P(n,m−1).

In a case where the first pixel P(n,m) is located on an nth horizontal display line HL(n) and an mth vertical display line VL(m), the second pixel P(n+1,m−1) is located on an (n+1)th horizontal display line HL(n+1) and an (m−1)th vertical display line VL(m−1), and the third pixel P(n,m−1) is located on the nth horizontal display line HL(N) and the (m−1)th vertical display line VL(m−1), the fifth TFT T5 of the first pixel P(n,m) is connected between a fourth node N4 of the first pixel P(n,m) and a first node N1 of the second pixel P(n+1,m−1). The sixth TFT T6 of the first pixel P(n,m) is connected between a second node N2 of the first pixel P(n,m) and a first node N1 of the third pixel P(n,m−1). In the seventh embodiment, the OLED, driving TFT DT, storage capacitor Cst, and first to fourth and seventh TFTs T1 to T4 and T7 are identical to those in the foregoing first embodiment.

The fifth TFT T5 of the first pixel P(n,m) is a switching element that supplies the reference voltage Vref stored in the first node N1 of the second pixel P(n+1,m−1) to the fourth node N4 of the first pixel P(n,m) as it turns on in response to the nth scan signal SCAN(n). The fifth TFT T5 of the first pixel P(n,m) comprises a gate connected to the nth scan line 12(n), a source connected to the fourth node N4 of the first pixel P(n,m), and a drain connected to the first node N1 of the second pixel P(n+1,m−1).

The sixth TFT T6 of the first pixel P(n,m) is a switching element that supplies the reference voltage Vref stored in the first node N1 of the third pixel P(n,m−1) to the second node N2 of the first pixel P(n,m) as it turns on in response to the (n−1)th scan signal SCAN(n−1). The sixth TFT T6 of the first pixel P(n,m) comprises a gate connected to the (n−1)th scan line 12(n−1), a source connected to the second node N2 of the first pixel P(n,m), and a drain connected to the first node N1 of the third pixel P(n,m−1).

The fifth TFT T5 of the first pixel P(n,m) is different from that of FIG. 3 in that it is not directly connected to Vref but instead connected to the first node N1 of the second pixel P(n+1,m−1). Since Vref is applied to the first node N1 of the second pixel P(n+1,m−1), the same effect may be achieved by connecting the fifth TFT T5 of the first pixel P(n,m) to the first node N1 of the second pixel P(n+1,m−1), rather than connecting it directly to Vref.

The sixth TFT T6 of the first pixel P(n,m) is different from that of FIG. 3 in that it is not directly connected to Vref but instead connected to the first node N1 of the third pixel P(n,m−1). Since Vref is applied to the first node N1 of the third pixel P(n,m−1), the same effect may be achieved by connecting the sixth TFT T6 of the first pixel P(n,m) to the first node N1 of the third pixel P(n,m−1), rather than connecting it directly to Vref.

The reason why the fifth and sixth TFTs T5 and T6 are not connected directly to Vref but connected to neighboring pixels is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 3, the third TFT T3, fifth TFT T5, and sixth TFT T6 are commonly connected to Vref. In order to do this, the power supply contact hole should be designed in a large size, or the number of power supply contact holes should be increased. However, as shown in FIG. 13, if the fifth and sixth TFTs T5 and T6 are connected from the first nodes N1 of the neighboring pixels P(n+1,m−1) and P(n,m−1) to one electrode of the first TFT T1, third TFT T3, and seventh TFT T7, rather than being connected directly to Vref, then it means two less TFTs to connect to the power supply contact hole. That is to say, the smaller the number of TFTs, the broader the choice of power supply contact hole designs.

Figure 14:
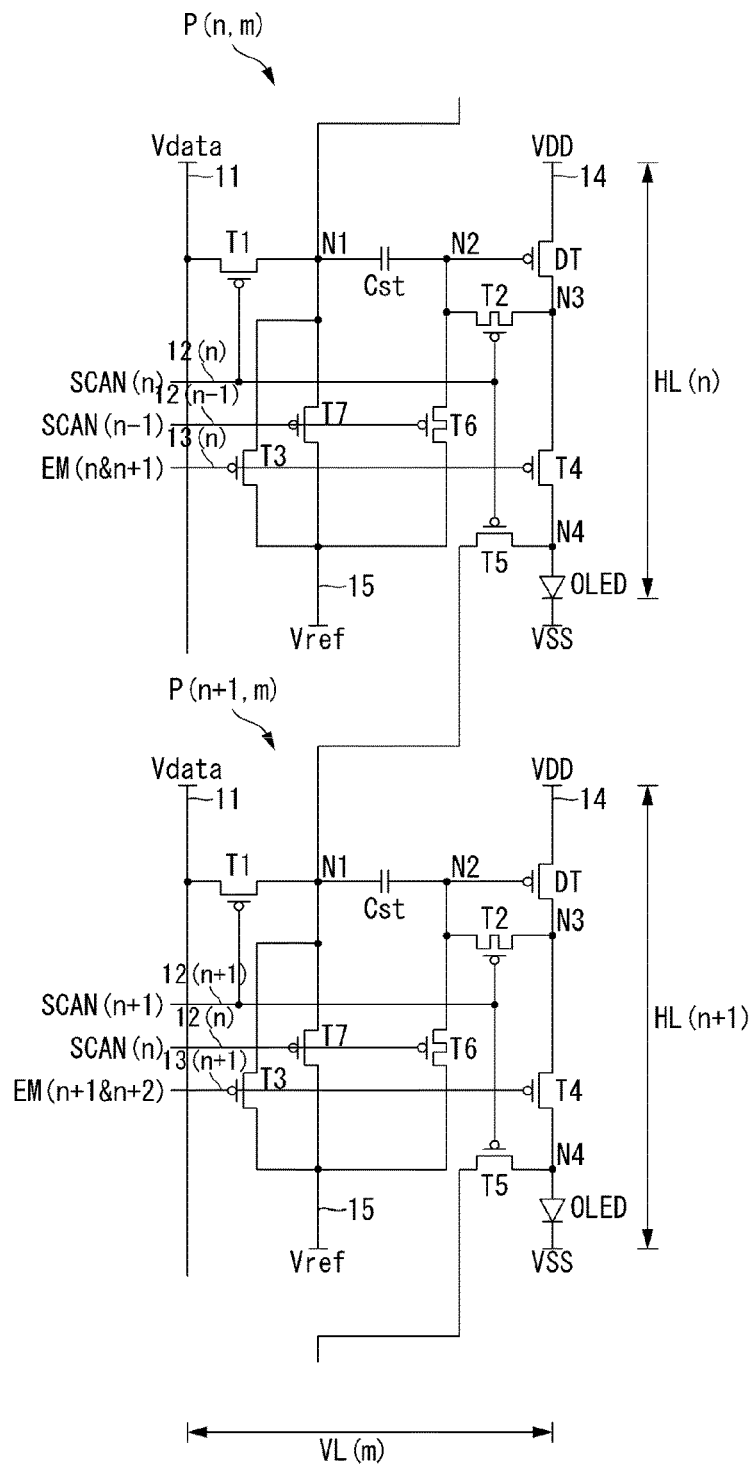
FIG. 14 is a circuit diagram of a pixel circuit according to an eighth embodiment of the present disclosure, which shows one modified embodiment of the connection configuration of the fifth TFT in the nth pixel circuit of FIG. 6.

FIG. 14 is a circuit diagram of a pixel circuit according to an eighth embodiment of the present disclosure, which shows one modified embodiment of the connection configuration of the fifth TFT in the nth pixel circuit of FIG. 6.

The pixel circuit of FIG. 14 is substantially identical to the nth pixel circuit of FIG. 6, except for the connection configuration of the fifth TFT T5. In the eighth embodiment, the same components as the foregoing first to seventh embodiments will be denoted by the same reference numerals, and a detailed description of them will be omitted.

Referring to FIG. 14, the pixel circuit will apply with respect to a first pixel P(n,m) (n and m are positive integers) and a second pixel P(n+1,m).

In a case where the first pixel P(n,m) is located on an nth horizontal display line HL(n) and an mth vertical display line VL(m) and the second pixel P(n+1,m) is located on an (n+1)th horizontal display line HL(n+1) and the mth vertical display line VL(m), the fifth TFT T5 of the first pixel P(n,m) is connected between a fourth node N4 of the first pixel P(n,m) and a first node N1 of the second pixel P(n+1,m). In the eighth embodiment, the OLED, driving TFT DT, storage capacitor Cst, and first to fourth and sixth and seventh TFTs T1 to T4 and T6 and T7 are identical to those in the foregoing second embodiment.

The fifth TFT T5 of the first pixel P(n,m) is a switching element that supplies the reference voltage Vref stored in the first node N1 of the second pixel P(n+1,m) to the fourth node N4 of the first pixel P(n,m) as it turns on in response to the nth scan signal SCAN(n). The fifth TFT T5 of the first pixel P(n,m) comprises a gate connected to the nth scan line 12(n), a source connected to the fourth node N4 of the first pixel P(n,m), and a drain connected to the first node N1 of the second pixel P(n+1,m).

The fifth TFT T5 of the first pixel P(n,m) is different from that of FIG. 6 in that it is not directly connected to Vref but instead connected to the first node N1 of the second pixel P(n+1,m). Since Vref is applied to the first node N1 of the second pixel P(n+1,m), the same effect may be achieved by connecting the fifth TFT T5 of the first pixel P(n,m) to the first node N1 of the second pixel P(n+1,m), rather than connecting it directly to Vref. The reason why the fifth TFT T5 is not connected directly to Vref but connected to a neighboring pixel is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 6, the third TFT T3, fifth TFT T5, sixth TFT T6, and seventh TFT T7 are commonly connected to Vref. In order to do this, the power supply contact hole should be designed in a large size, or the number of power supply contact holes should be increased. However, as shown in FIG. 14, if the fifth TFT T5 is connected from the first node N1 of the neighboring pixel P(n+1,m) to one electrode of the first TFT T1 and third TFT T3, rather than being connected directly to Vref, then it means one less TFT to connect to the power supply contact hole. That is to say, the smaller the number of TFTs, the broader the choice of power supply contact hole designs.

Figure 15:
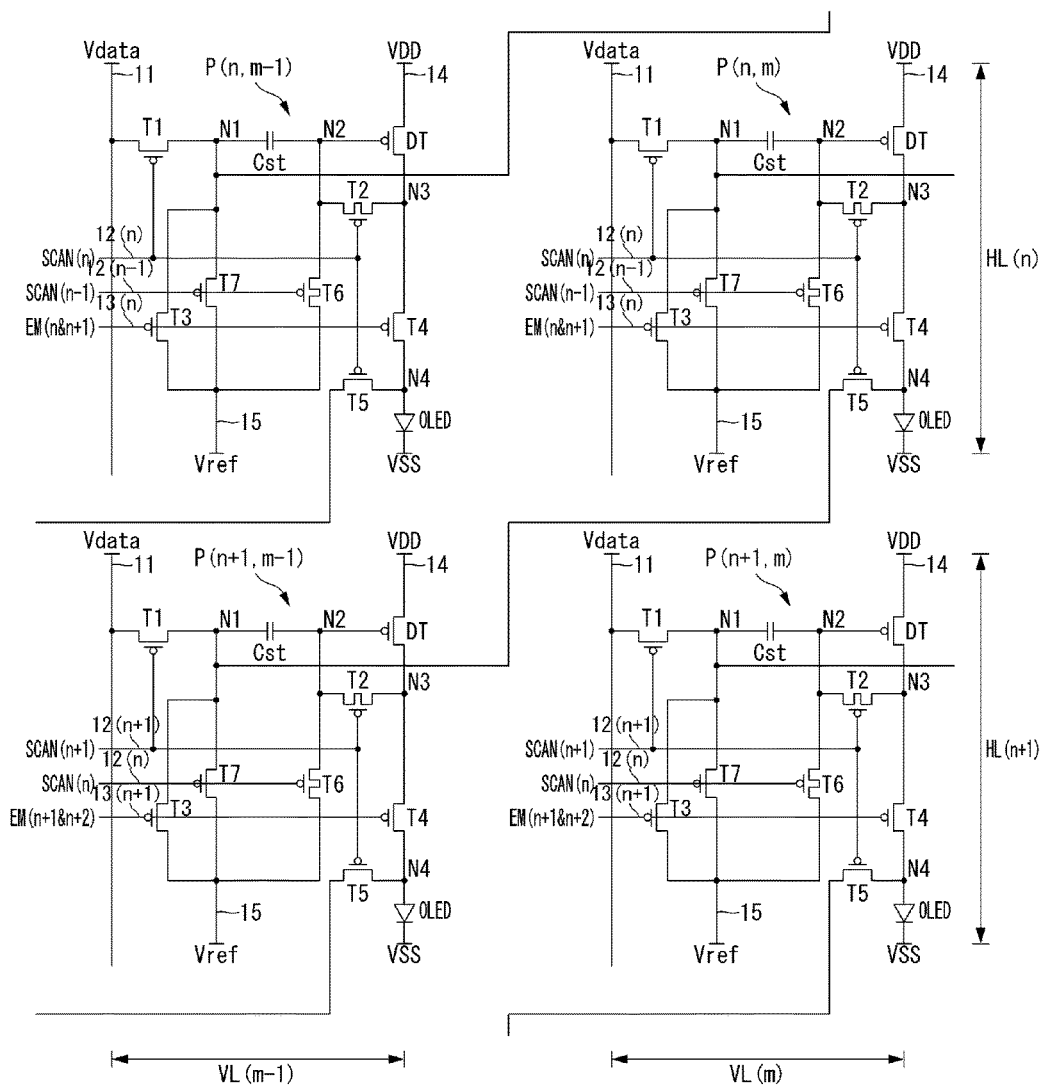
FIG. 15 is a circuit diagram of a pixel circuit according to a ninth embodiment of the present disclosure, which shows another modified embodiment of the connection configuration of the fifth TFT in the nth pixel circuit of FIG. 6.

FIG. 15 is a circuit diagram of a pixel circuit according to a ninth embodiment of the present disclosure, which shows another modified embodiment of the connection configuration of the fifth TFT in the nth pixel circuit of FIG. 6.

The pixel circuit of FIG. 15 is substantially identical to the nth pixel circuit of FIG. 6, except for the connection configuration of the fifth TFT T5. In the ninth embodiment, the same components as the foregoing first to eighth embodiments will be denoted by the same reference numerals, and a detailed description of them will be omitted.

Referring to FIG. 15, the pixel circuit will apply with respect to a first pixel P(n,m) (n and m are positive integers) and a second pixel P(n+1,m−1).

In a case where the first pixel P(n,m) is located on an nth horizontal display line HL(n) and an mth vertical display line VL(m) and the second pixel P(n+1,m−1) is located on an (n+1)th horizontal display line HL(n+1) and an (m−1)th vertical display line VL(m−1), the fifth TFT T5 of the first pixel P(n,m) is connected between a fourth node N4 of the first pixel P(n,m) and a first node N1 of the second pixel P(n+1,m−1). In the ninth embodiment, the OLED, driving TFT DT, storage capacitor Cst, and first to fourth and sixth and seventh TFTs T1 to T4 and T6 and T7 are identical to those in the foregoing second embodiment.

The fifth TFT T5 of the first pixel P(n,m) is a switching element that supplies the reference voltage Vref stored in the first node N1 of the second pixel P(n+1,m−1) to the fourth node N4 of the first pixel P(n,m) as it turns on in response to the nth scan signal SCAN(n). The fifth TFT T5 of the first pixel P(n,m) comprises a gate connected to the nth scan line 12(n), a source connected to the fourth node N4 of the first pixel P(n,m), and a drain connected to the first node N1 of the second pixel P(n+1,m−1).

The fifth TFT T5 of the first pixel P(n,m) is different from that of FIG. 6 in that it is not directly connected to Vref but instead connected to the first node N1 of the second pixel P(n+1,m−1). Since Vref is applied to the first node N1 of the second pixel P(n+1,m−1), the same effect may be achieved by connecting the fifth TFT T5 of the first pixel P(n,m) to the first node N1 of the second pixel P(n+1,m−1), rather than connecting it directly to Vref. The reason why the fifth TFT T5 is not connected directly to Vref but connected to a neighboring pixel is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 6, the third TFT T3, fifth TFT T5, sixth TFT T6, and seventh TFT T7 are commonly connected to Vref. In order to do this, the power supply contact hole should be designed in a large size, or the number of power supply contact holes should be increased. However, as shown in FIG. 15, if the fifth TFT T5 is connected from the first node N1 of the neighboring pixel P(n+1,m−1) to one electrode of the first TFT T1 and third TFT T3, rather than being connected directly to Vref, then it means one less TFT to connect to the power supply contact hole. That is to say, the smaller the number of TFTs, the broader the choice of power supply contact hole designs.

Figure 16:
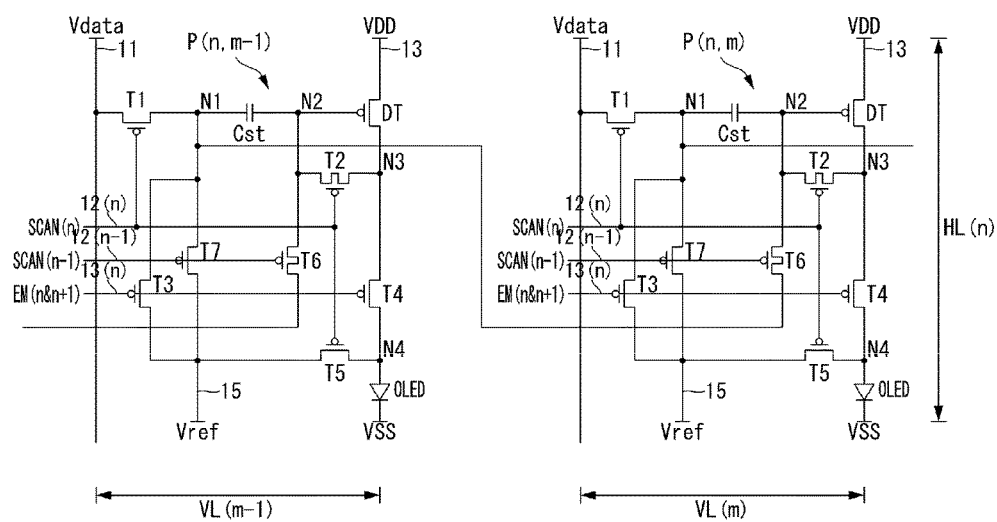
FIG. 16 is a circuit diagram of a pixel circuit according to a tenth embodiment of the present disclosure, which shows one modified embodiment of the connection configuration of the sixth TFT in the nth pixel circuit of FIG. 6.

FIG. 16 is a circuit diagram of a pixel circuit according to a tenth embodiment of the present disclosure, which shows one modified embodiment of the connection configuration of the sixth TFT in the nth pixel circuit of FIG. 6.

The pixel circuit of FIG. 16 is substantially identical to the nth pixel circuit of FIG. 6, except for the connection configuration of the sixth TFT T6. In the tenth embodiment, the same components as the foregoing first to ninth embodiments will be denoted by the same reference numerals, and a detailed description of them will be omitted.

Referring to FIG. 16, the pixel circuit will apply with respect to a first pixel P(n,m) (n and m are positive integers) and a second pixel P(n,m−1).

In a case where the first pixel P(n,m) is located on an nth horizontal display line HL(n) and an mth vertical display line VL(m) and the second pixel P(n,m−1) is located on an nth horizontal display line HL(n) and an (m−1)th vertical display line VL(m−1), the sixth TFT T6 of the first pixel P(n,m) is connected between a second node N2 of the first pixel P(n,m) and a first node N1 of the second pixel P(n,m−1). In this embodiment, the OLED, driving TFT DT, storage capacitor Cst, and first to fifth and seventh TFTs T1 to T5 and T7 are identical to those in the foregoing second embodiment.

The sixth TFT T6 of the first pixel P(n,m) is a switching element that supplies the reference voltage Vref stored in the first node N1 of the second pixel P(n,m−1) to the second node N2 of the first pixel P(n,m) as it turns on in response to the (n−1)th scan signal SCAN(n−1). The sixth TFT T6 of the first pixel P(n,m) comprises a gate connected to the (n−1)th scan line 12(n−1), a source connected to the second node N2 of the first pixel P(n,m), and a drain connected to the first node N1 of the second pixel P(n,m−1).

The sixth TFT T6 of the first pixel P(n,m) is different from that of FIG. 6 in that it is not directly connected to Vref but instead connected to the first node N1 of the second pixel P(n,m−1). Since Vref is applied to the first node N1 of the second pixel P(n,m−1), the same effect may be achieved by connecting the sixth TFT T6 of the first pixel P(n,m) to the first node N1 of the second pixel P(n,m−1), rather than connecting it directly to Vref. The reason why the sixth TFT T6 is not connected directly to Vref but connected to a neighboring pixel is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 6, the third TFT T3, fifth TFT T5, sixth TFT T6, and seventh TFT T7 are commonly connected to Vref. In order to do this, the power supply contact hole should be designed in a large size, or the number of power supply contact holes should be increased. However, as shown in FIG. 16, if the sixth TFT T6 is connected from the first node N1 of the neighboring pixel P(n,m−1) to one electrode of the first TFT T1 and third TFT T3, rather than being connected directly to Vref, then it means one less TFT to connect to the power supply contact hole. That is to say, the smaller the number of TFTs, the broader the choice of power supply contact hole designs.

Figure 17:
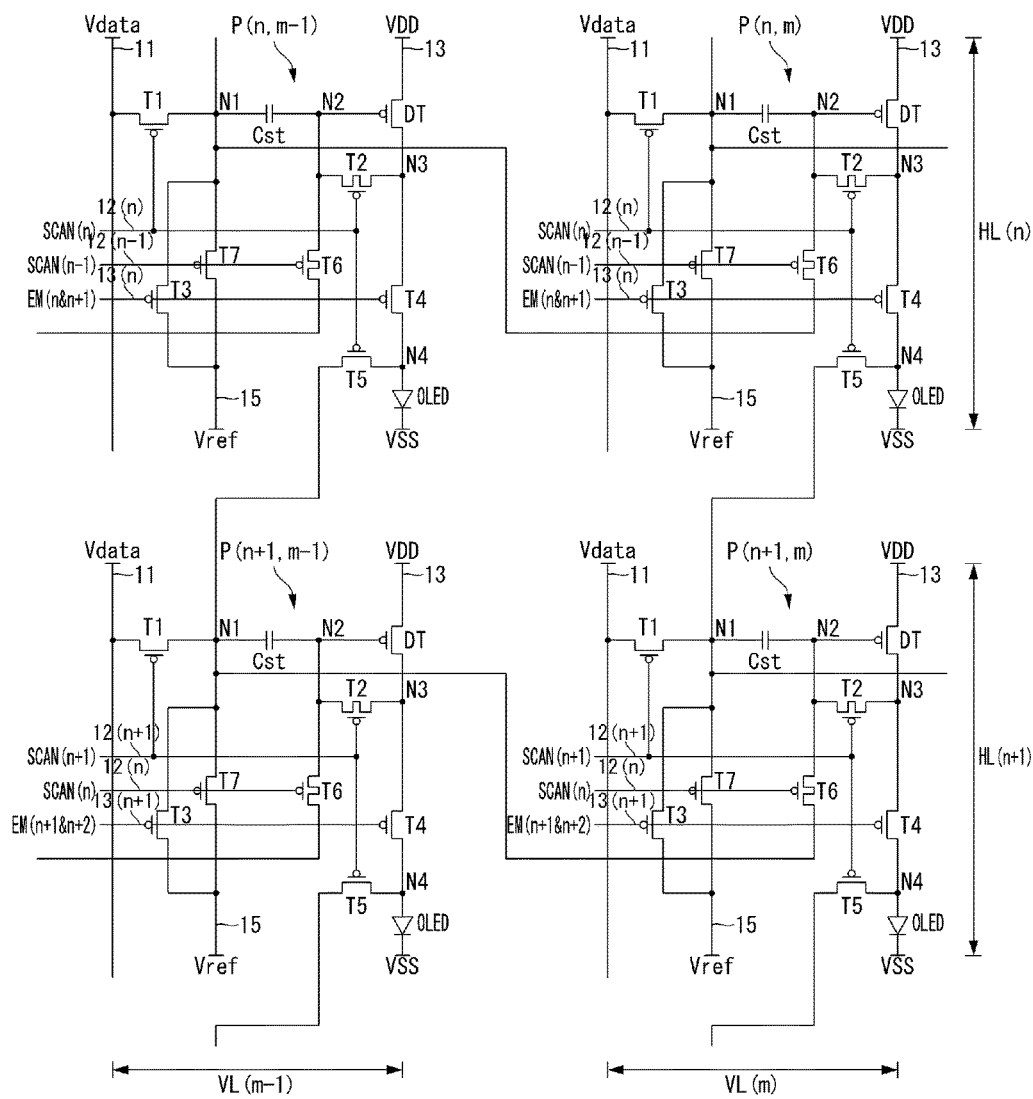
FIG. 17 is a circuit diagram of a pixel circuit according to an eleventh embodiment of the present disclosure, which shows one modified embodiment of the connection configuration of the fifth and sixth TFTs in the nth pixel circuit of FIG. 6.

FIG. 17 is a circuit diagram of a pixel circuit according to an eleventh embodiment of the present disclosure, which shows one modified embodiment of the connection configuration of the fifth and sixth TFTs in the nth pixel circuit of FIG. 6.

The pixel circuit of FIG. 17 is substantially identical to the nth pixel circuit of FIG. 6, except for the connection configuration of the fifth and sixth TFTs T5 and T6. In the eleventh embodiment, the same components as the foregoing first to tenth embodiments will be denoted by the same reference numerals, and a detailed description of them will be omitted.

Referring to FIG. 17, the pixel circuit will apply with respect to a first pixel P(n,m) (n and m are positive integers), a second pixel P(n+1,m), and a third pixel P(n,m−1).

In a case where the first pixel P(n,m) is located on an nth horizontal display line HL(n) and an mth vertical display line VL(m), the second pixel P(n+1,m) is located on an (n+1)th horizontal display line HL(n+1) and the mth vertical display line VL(m), and the third pixel P(n,m−1) is located on the nth horizontal display line HL(N) and an (m−1)th vertical display line VL(m−1), the fifth TFT T5 of the first pixel P(n,m) is connected between a fourth node N4 of the first pixel P(n,m) and a first node N1 of the second pixel P(n+1,m). The sixth TFT T6 of the first pixel P(n,m) is connected between a second node N2 of the first pixel P(n,m) and a first node N1 of the third pixel P(n,m−1). In the eleventh embodiment, the OLED, driving TFT DT, storage capacitor Cst, and first to fourth and seventh TFTs T1 to T4 and T7 are identical to those in the foregoing second embodiment.

The fifth TFT T5 of the first pixel P(n,m) is a switching element that supplies the reference voltage Vref stored in the first node N1 of the second pixel P(n+1,m) to the fourth node N4 of the first pixel P(n,m) as it turns on in response to the nth scan signal SCAN(n). The fifth TFT T5 of the first pixel P(n,m) comprises a gate connected to the nth scan line 12(*n*), a source connected to the fourth node N4 of the first pixel P(n,m), and a drain connected to the first node N1 of the second pixel P(n+1,m).

The sixth TFT T6 of the first pixel P(n,m) is a switching element that supplies the reference voltage Vref stored in the first node N1 of the third pixel P(n,m−1) to the second node N2 of the first pixel P(n,m) as it turns on in response to the (n−1)th scan signal SCAN(n−1). The sixth TFT T6 of the first pixel P(n,m) comprises a gate connected to the (n−1)th scan line 12(*n*−1), a source connected to the second node N2 of the first pixel P(n,m), and a drain connected to the first node N1 of the third pixel P(n,m−1).

The fifth TFT T5 of the first pixel P(n,m) is different from that of FIG. 6 in that it is not directly connected to Vref but instead connected to the first node N1 of the second pixel P(n+1,m). Since Vref is applied to the first node N1 of the second pixel P(n+1,m), the same effect may be achieved by connecting the fifth TFT T5 of the first pixel P(n,m) to the first node N1 of the second pixel P(n+1,m), rather than connecting it directly to Vref.

The sixth TFT T6 of the first pixel P(n,m) is different from that of FIG. 6 in that it is not directly connected to Vref but instead connected to the first node N1 of the third pixel P(n,m−1). Since Vref is applied to the first node N1 of the third pixel P(n,m−1), the same effect may be achieved by connecting the sixth TFT T6 of the first pixel P(n,m) to the first node N1 of the third pixel P(n,m−1), rather than connecting it directly to Vref.

The reason why the fifth and sixth TFTs T5 and T6 are not connected directly to Vref but connected to neighboring pixels is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 6, the third TFT T3, fifth TFT T5, sixth TFT T6, and seventh TFT T7 are commonly connected to Vref. In order to do this, the power supply contact hole should be designed in a large size, or the number of power supply contact holes should be increased. However, as shown in FIG. 17, if the fifth and sixth TFTs T5 and T6 are connected from the first nodes N1 of the neighboring pixels P(n+1,m) and P(n,m−1) to one electrode of the first TFT T1 and third TFT T3, rather than being connected directly to Vref, then it means two less TFTs to connect to the power supply contact hole. That is to say, the smaller the number of TFTs, the broader the choice of power supply contact hole designs.

Figure 18:
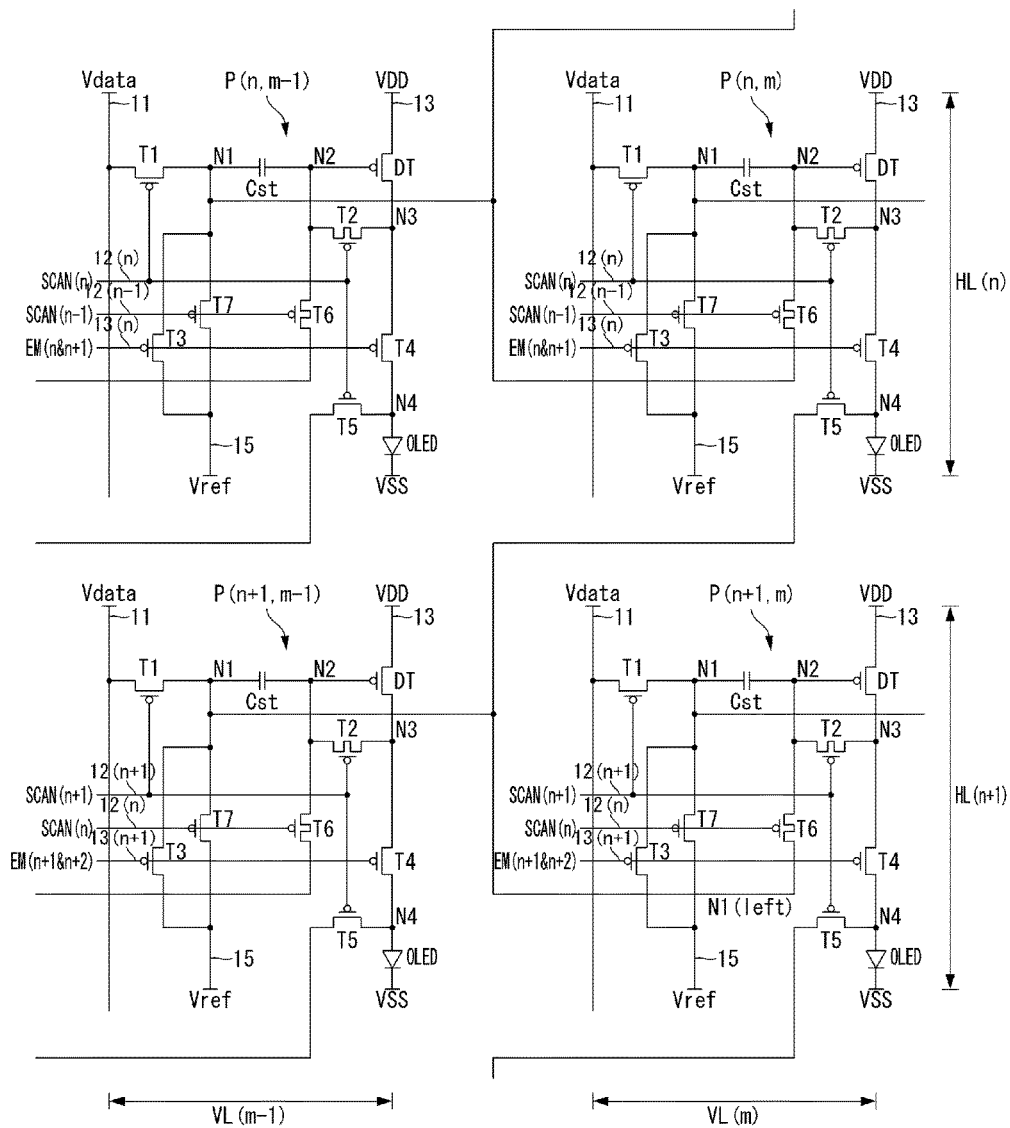
FIG. 18 is a circuit diagram of a pixel circuit according to a twelfth embodiment of the present disclosure, which shows another modified embodiment of the connection configuration of the fifth and sixth TFTs in the nth pixel circuit of FIG. 6.

FIG. 18 is a circuit diagram of a pixel circuit according to a twelfth embodiment of the present disclosure, which shows another modified embodiment of the connection configuration of the fifth and sixth TFTs in the nth pixel circuit of FIG. 6.

The pixel circuit of FIG. 18 is substantially identical to the nth pixel circuit of FIG. 6, except for the connection configuration of the fifth and sixth FTs T5 and T6. In the twelfth embodiment, the same components as the foregoing first to eleventh embodiments will be denoted by the same reference numerals, and a detailed description of them will be omitted.

Referring to FIG. 18, the pixel circuit will apply with respect to a first pixel P(n,m) (n and m are positive integers), a second pixel P(n+1,m−1), and a third pixel P(n,m−1).

In a case where the first pixel P(n,m) is located on an nth horizontal display line HL(n) and an mth vertical display line VL(m), the second pixel P(n+1,m−1) is located on an (n+1)th horizontal display line HL(n+1) and an (m−1)th vertical display line VL(m−1), and the third pixel P(n,m−1) is located on the nth horizontal display line HL(n) and the (m−1)th vertical display line VL(m−1), the fifth TFT T5 of the first pixel P(n,m) is connected between a fourth node N4 of the first pixel P(n,m) and a first node N1 of the second pixel P(n+1,m−1). The sixth TFT T6 of the first pixel P(n,m) is connected between a second node N2 of the first pixel P(n,m) and a first node N1 of the third pixel P(n,m−1). In the twelfth embodiment, the OLED, driving TFT DT, storage capacitor Cst, and first to fourth and seventh TFTs T1 to T4 and T7 are identical to those in the foregoing second embodiment.

The fifth TFT T5 of the first pixel P(n,m) is a switching element that supplies the reference voltage Vref stored in the first node N1 of the second pixel P(n+1,m−1) to the fourth node N4 of the first pixel P(n,m) as it turns on in response to the nth scan signal SCAN(n). The fifth TFT T5 of the first pixel P(n,m) comprises a gate connected to the nth scan line 12(*n*), a source connected to the fourth node N4 of the first pixel P(n,m), and a drain connected to the first node N1 of the second pixel P(n+1,m−1).

The sixth TFT T6 of the first pixel P(n,m) is a switching element that supplies the reference voltage Vref stored in the first node N1 of the third pixel P(n,m−1) to the second node N2 of the first pixel P(n,m) as it turns on in response to the (n−1)th scan signal SCAN(n−1). The sixth TFT T6 of the first pixel P(n,m) comprises a gate connected to the (n−1)th scan line 12(*n*−1), a source connected to the second node N2 of the first pixel P(n,m), and a drain connected to the first node N1 of the third pixel P(n,m−1).

The fifth TFT T5 of the first pixel P(n,m) is different from that of FIG. 6 in that it is not directly connected to Vref but instead connected to the first node N1 of the second pixel P(n+1,m−1). Since Vref is applied to the first node N1 of the second pixel P(n+1,m−1), the same effect may be achieved by connecting the fifth TFT T5 of the first pixel P(n,m) to the first node N1 of the second pixel P(n+1,m−1), rather than connecting it directly to Vref.

The sixth TFT T6 of the first pixel P(n,m) is different from that of FIG. 6 in that it is not directly connected to Vref but instead connected to the first node N1 of the third pixel P(n,m−1). Since Vref is applied to the first node N1 of the third pixel P(n,m−1), the same effect may be achieved by connecting the sixth TFT T6 of the first pixel P(n,m) to the first node N1 of the third pixel P(n,m−1), rather than connecting it directly to Vref.

The reason why the fifth and sixth TFTs T5 and T6 are not connected directly to Vref but connected to neighboring pixels is to improve the degree of design freedom.

In detail, a power supply contact hole is required to connect a TFT to Vref, but there is a limit on the number of TFTs that can be connected to Vref via one power supply contact hole due to limited design area. In the pixel circuit of FIG. 6, the third TFT T3, fifth TFT T5, sixth TFT T6, and seventh TFT T7 are commonly connected to Vref. In order to do this, the power supply contact hole should be designed in a large size, or the number of power supply contact holes should be increased. However, as shown in FIG. 18, if the fifth and sixth TFTs T5 and T6 are connected from the first nodes N1 of the neighboring pixels P(n+1,m−1) and P(n,m−1) to one electrode of the first TFT T1 and third TFT T3, rather than being connected directly to Vref, then it means two less TFTs to connect to the power supply contact hole. That is to say, the smaller the number of TFTs, the broader the choice of power supply contact hole designs.

Figure 19:
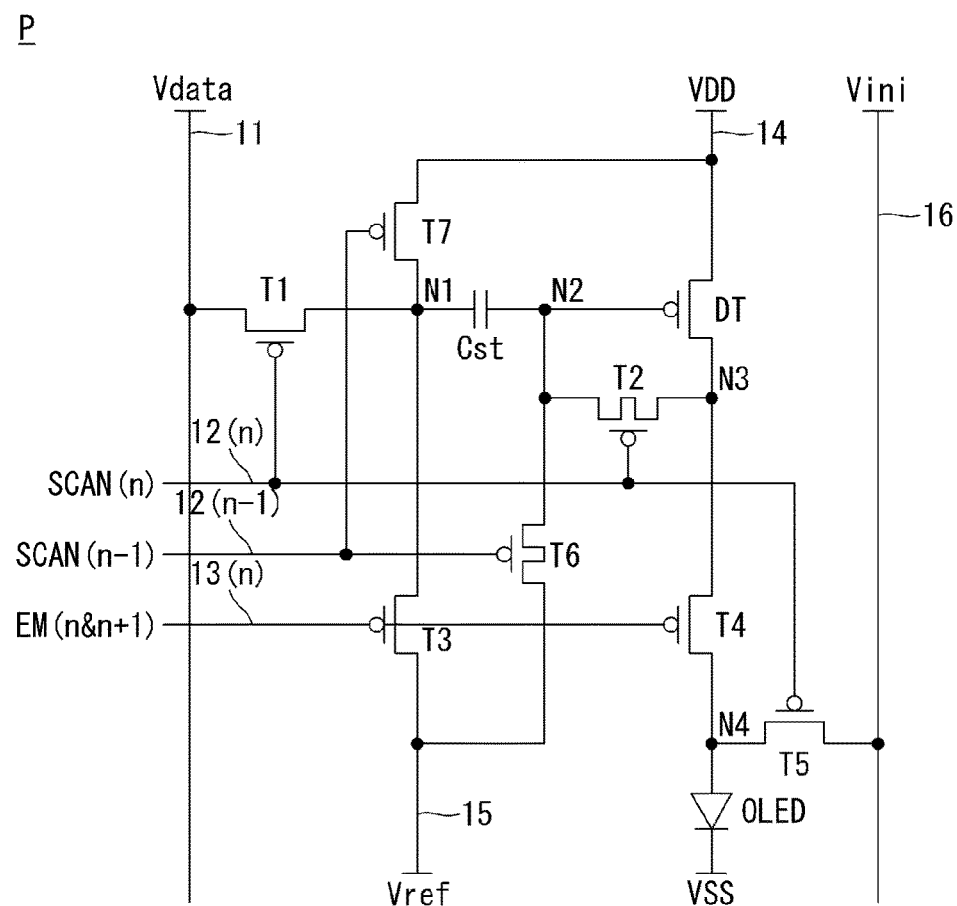
FIG. 19 is a circuit diagram of a pixel circuit according to a thirteenth embodiment of the present disclosure.

FIG. 19 is a circuit diagram of a pixel circuit according to a thirteenth y embodiment of the present disclosure.

The nth pixel circuit of FIG. 19 is substantially identical to the nth pixel circuit of FIG. 3, except for the connection configuration of the fifth TFT T5. In the thirteenth embodiment, the same components as the foregoing first to twelfth embodiments will be denoted by the same reference numerals, and a detailed description of them will be omitted.

Referring to FIG. 19, the nth pixel circuit is further connected to a power supply wire (or Vini wire) 16 to which the reset voltage Vini is applied. While the reference voltage Vref is higher than the low-level power supply voltage VSS and lower than the high-level power supply voltage VDD, the reset voltage Vini may be higher than the low-level power supply voltage VSS and lower than the reference voltage Vref.

The nth pixel circuit comprises a fifth TFT T5 connected between the fourth node N4 and the power supply wire 16 to which the reset voltage Vini is applied. In this embodiment, the OLED, driving TFT DT, storage capacitor Cst, and first to fourth and sixth and seventh TFTs T1 to T4 and T6 and T7 are identical to those in the foregoing first embodiment.

The fifth TFT T5 is a switching element that supplies the reset voltage Vini to the fourth node N4 in response to the nth scan signal SCAN(n). The fifth TFT T5 comprises a gate connected to the nth scan line 12(n), a source connected to the fourth node N4, and a drain connected to the power supply wire 16 to which the reset voltage Vini is applied.

Since the reset voltage Vini applied to the fourth node N4 through the fifth TFT T5 is lower than the reference voltage Vref, the anode potential of the OLED may be reduced to well below an operating point voltage of the OLED in a sampling operation for sampling the threshold voltage of the driving TFT, which is effective in preventing unnecessary light emission from the OLED.

In the first embodiment, the reference voltage Vref used to reset the first and second nodes N1 and N2 is supplied to the anode of the OLED as well in the sampling operation. The drive current applied to the OLED in the emission period is proportional to the square root of "Vdata−Vref", so there is a limit to how much the reference voltage Vref can be reduced for the sake of contrast ratio. This is because, when the reference voltage Vref is sufficiently reduced, the contrast ratio may be lowered as the luminance is increased when displaying black. In order to prevent unnecessary light emission in the operation for sampling the threshold voltage of the driving TFT DT, the fourth TFT T4 may be turned off, and at the same time the anode potential may be lowered to well below the operating point voltage of the OLED. This is more effective because it prevents unusual light emission from the OLED due to any leakage current that might be generated in the fourth TFT T4 in the operation for sampling the threshold voltage of the driving TFT DT.

Figure 20:
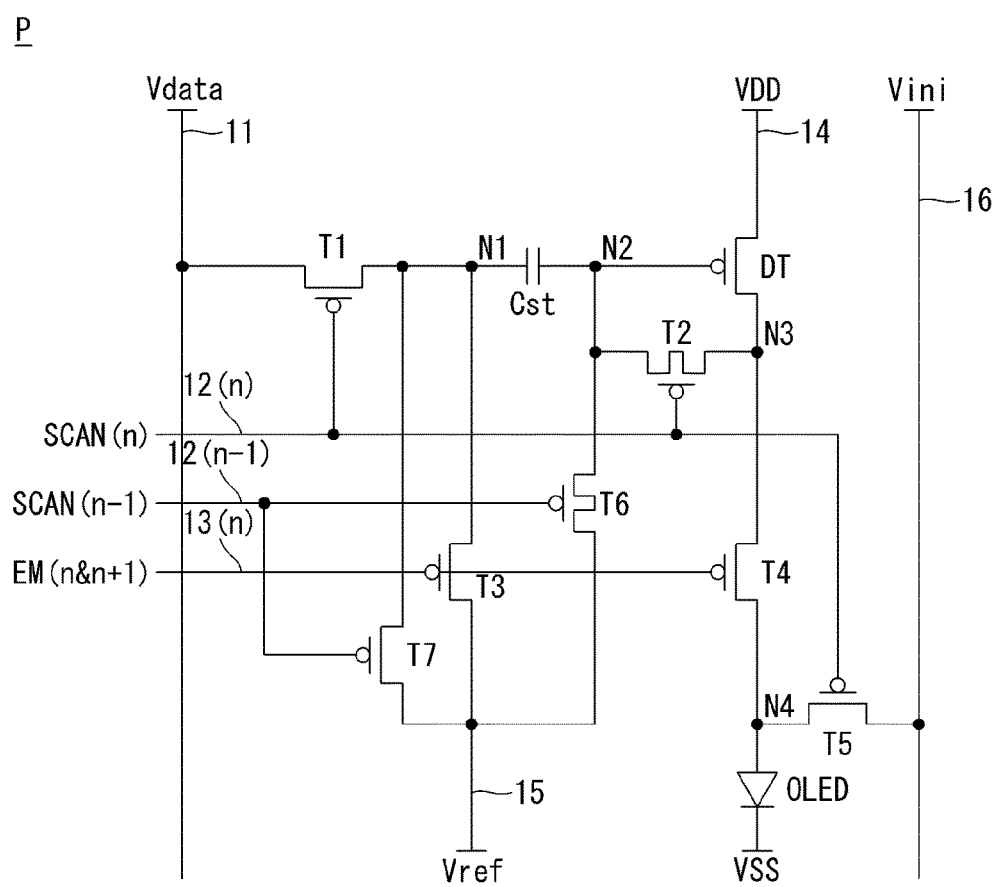
FIG. 20 is a circuit diagram of a pixel circuit according to a fourteenth embodiment of the present disclosure.

FIG. 20 is a circuit diagram of a pixel circuit according to a fourteenth embodiment of the present disclosure.

The nth pixel circuit of FIG. 20 is substantially identical to the nth pixel circuit of FIG. 6, except for the connection configuration of the fifth TFT T5. In the fourteenth embodiment, the same components as the foregoing first to thirteenth embodiments will be denoted by the same reference numerals, and a detailed description of them will be omitted.

Referring to FIG. 20, the nth pixel circuit is further connected to a power supply wire 16 to which the reset voltage Vini is applied. While the reference voltage Vref is higher than the low-level power supply voltage VSS and lower than the high-level power supply voltage VDD, the reset voltage Vini may be higher than the low-level power supply voltage VSS and lower than the reference voltage Vref.

The nth pixel circuit comprises a fifth TFT T5 connected between the fourth node N4 and the power supply wire (or Vini wire) 16 to which the reset voltage Vini is applied. In the fourteenth embodiment, the OLED, driving TFT DT, storage capacitor Cst, and first to fourth and sixth and seventh TFTs T1 to T4 and T6 and T7 are identical to those in the foregoing second embodiment.

The fifth TFT T5 is a switching element that supplies the reset voltage Vini to the fourth node N4 in response to the nth scan signal SCAN(n). The fifth TFT T5 comprises a gate connected to the nth scan line 12(n), a source connected to the fourth node N4, and a drain connected to the power supply wire 16 to which the reset voltage Vini is applied.

Since the reset voltage Vini applied to the fourth node N4 through the fifth TFT T5 is lower than the reference voltage Vref, the anode potential of the OLED may be reduced to well below an operating point voltage of the OLED in a sampling operation for sampling the threshold voltage of the driving TFT, which is effective in preventing unnecessary light emission from the OLED.

In the second embodiment, the reference voltage Vref used to reset the first and second nodes N1 and N2 is supplied to the anode of the OLED as well in the sampling operation. The drive current applied to the OLED in the emission period is proportional to the square root of "Vdata−Vref", so there is a limit to how much the reference voltage Vref can be reduced for the sake of contrast ratio. This is because, when the reference voltage Vref is sufficiently reduced, the contrast ratio may be lowered as the luminance is increased when displaying black. In order to prevent unnecessary light emission in the operation for sampling the threshold voltage of the driving TFT DT, the fourth TFT T4 may be turned off, and at the same time the anode potential may be lowered to well below the operating point voltage of the OLED. This is more effective because it prevents unusual light emission from the OLED due to any leakage current that might be generated in the fourth TFT T4 in the operation for sampling the threshold voltage of the driving TFT DT.

Figure 21:
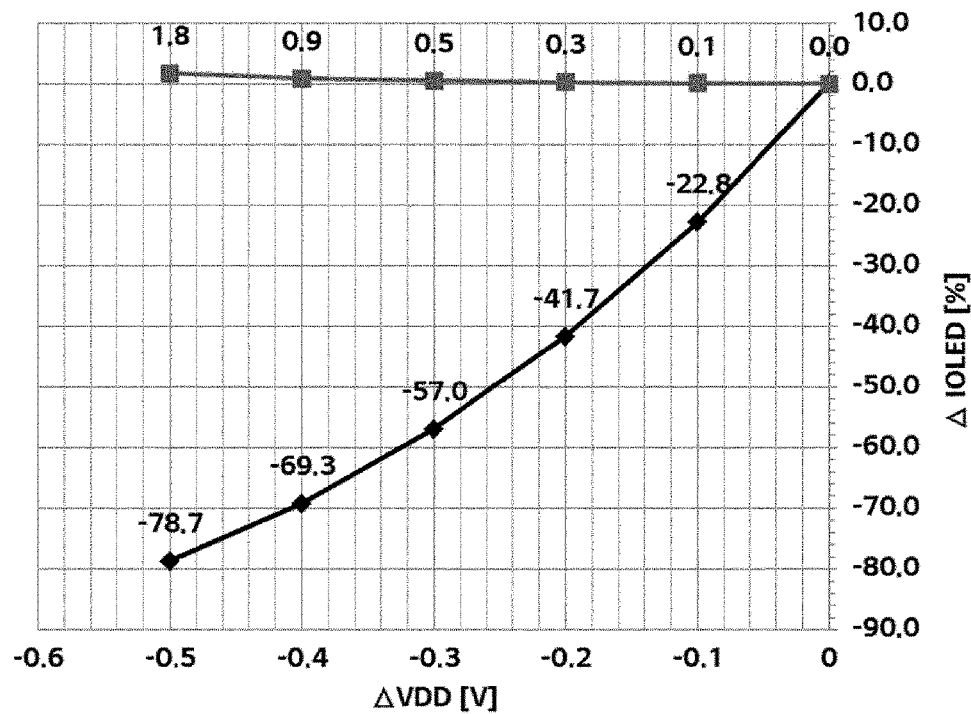
FIG. 21 is a graph of simulation results showing variation of OLED drive current with VDD voltage drop for the present disclosure and the related art.

FIG. 21 is a graph of simulation results showing variation of OLED drive current with VDD voltage drop for the present disclosure and the related art.

Referring to FIG. 21, in the case of an internal compensation circuit according to the related art (indicated by a line with diamond data points), it can be observed that the amount of decrease in OLED drive current Ioled decreases with increasing VDD voltage drop (IR drop), since the OLED drive current Ioled is affected by the high-level power supply voltage VDD of the pixel. That is, if VDD varies depending on the position of the pixel within the panel due to a VDD voltage drop (IR drop), this creates a difference between the OLED drive current Ioled and the current required for the pixel, making it hard to obtain uniform picture quality.

On the contrary, in the case of an external compensation circuit according to the present disclosure (indicated by a line with square data points), the OLED drive current Ioled is not affected by VDD. Therefore, even if the picture quality becomes non-uniform due to a voltage drop across the VDD wire, the brightness and color of the pixels may be uniform across the entire screen, without the VDD wire having a low-resistance design or a mesh configuration.

Figure 22:
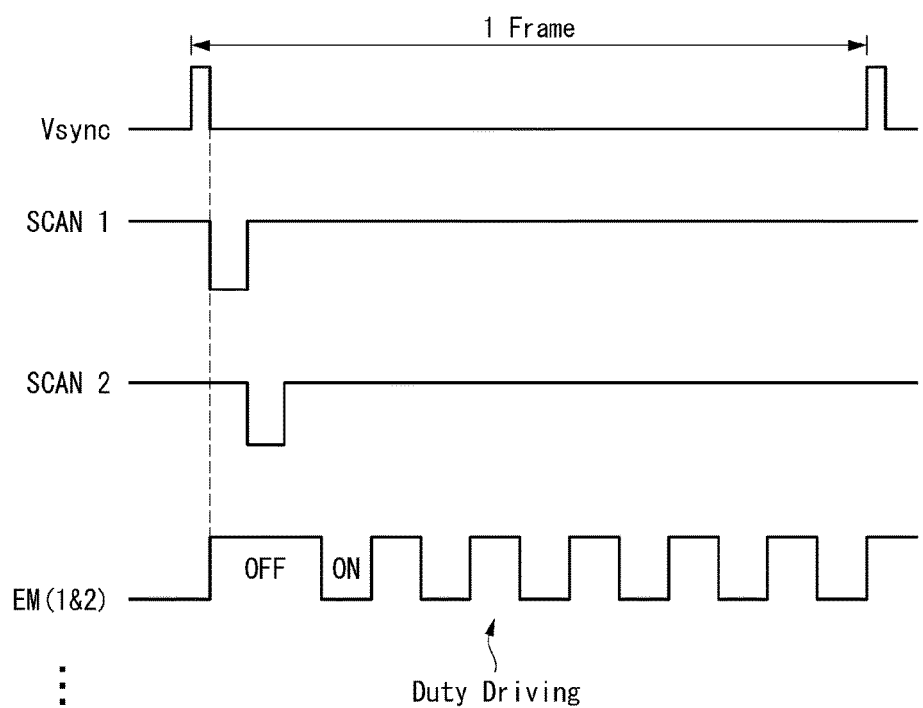
FIG. 22 is a waveform diagram showing an example in which an EM signal is modulated with a PWM duty cycle of 50% or less during the pixel's emission period.

FIG. 22 is a waveform diagram showing an example in which an EM signal is modulated with a PWM duty cycle of 50% or below during the pixel's emission period.

In FIG. 22, SCAN1 and EM(1&2) are the first scan signal and EM signal, respectively, which are applied to the pixels P arranged on the first horizontal line HL(1) of the display panel 100. SCAN2 and EM(1&2) are the second scan signal and EM signal, respectively, which are applied to the pixels P arranged on the second horizontal line HL(2) of the display panel 100. By addressing data to the pixels during the sampling period and then switching the EM signal EM on and off with a duty cycle of 50% or less during the emission period, flickering and afterimages may be reduced, thereby enhancing picture quality. Also, Vsg of the driving TFT DT may be stored in the storage capacitor CSt during the off time of the EM signal EM in the emission period, which allows for stable duty driving without having to write additional data to the pixels.

Figure 23:
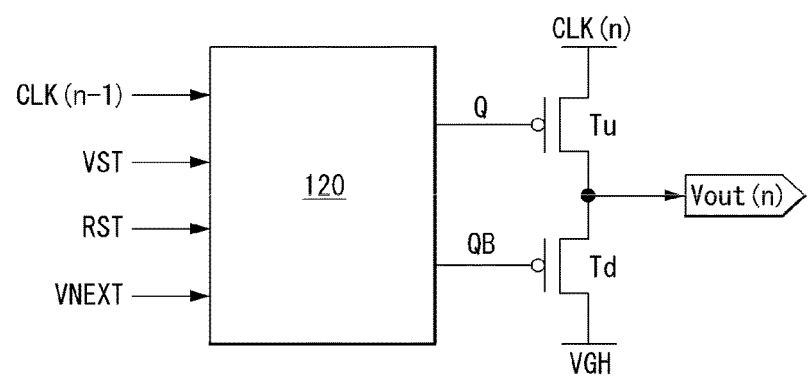
FIG. 23 is a circuit diagram schematically showing one stage at which a shift register of a gate driver outputs a gate pulse according to an embodiment of the present disclosure.
Figure 24:
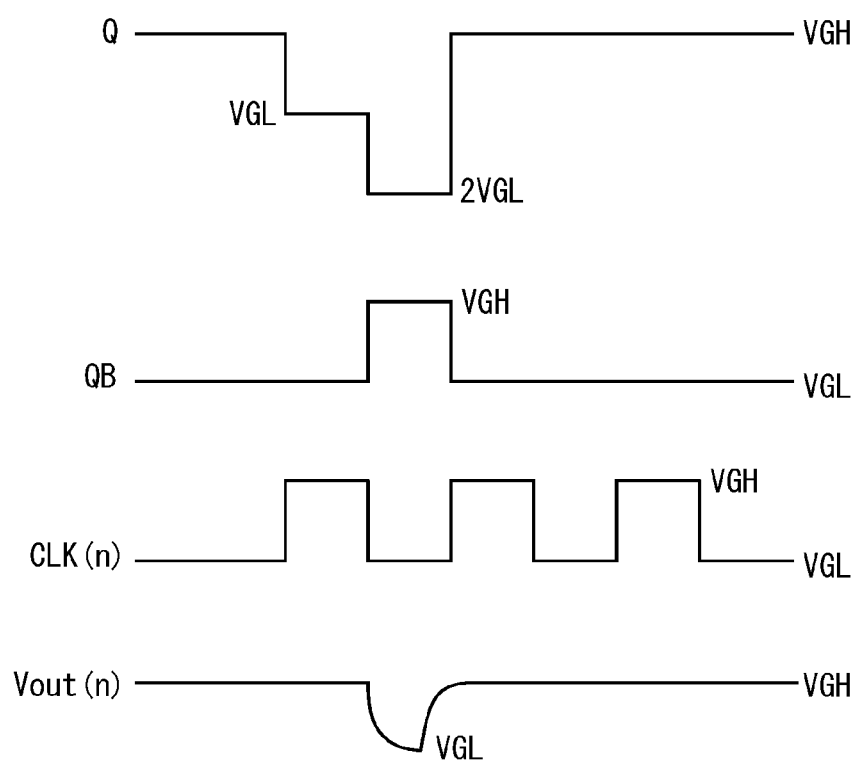
FIG. 24 is a waveform diagram showing an operation of the stage of FIG. 23.
Figure 25:
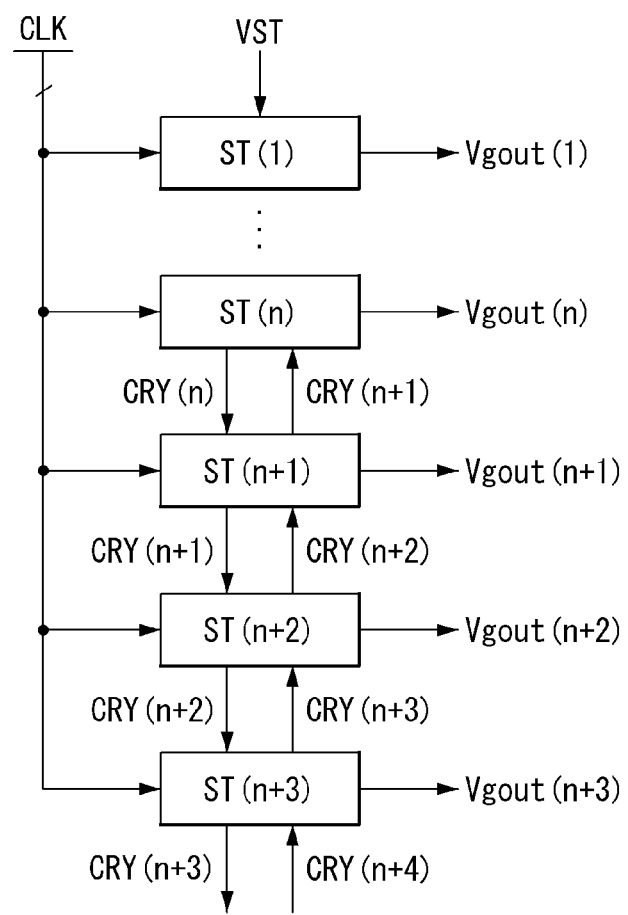
FIG. 25 is a view showing stages connected as a cascade in the shift register of the gate driver according to an embodiment of the present disclosure.

FIGS. 23 to 25 are views explaining shift registers of the gate driver 108.

Referring to FIGS. 23 to 25, the scan driver 103 and EM driver 104 of the gate driver 108 each comprise a shift register that sequentially shifts outputs in response to a gate timing control signal from the timing controller 110.

The shift registers of the gate driver 108 comprise a plurality of stages ST(1) to ST(n+3) connected as a cascade to shift output voltages in synchronization with shift clock timings. The shift registers receive a start pulse VST or a carry signal received from the previous stage ST(1) to ST(n+3) as a start pulse, and generate an output signal upon receipt of a clock. The output signal of the scan driver 103 is a scan signal, and the output signal of the EM driver 104 is an EM signal.

Each of the stages ST(1) to ST(n+3) of the shift registers comprises a pull-up transistor Tu that discharges the output terminal Vout(n) in response to a Q node voltage so that the voltage of the output signal falls to the gate-on voltage VGL, a pull-down transistor Td that stores an output voltage Vout(n) in response to a QB node voltage so that the voltage of the output signal rises to the gate-off voltage VGH, and a switching circuit 120 that charges or discharges the Q node and the QB node.

Once the Q node is pre-discharged to VGL, the pull-up transistor Tu discharges the output terminal to the gate-on voltage VGL of a shift clock CLK(n) when the shift clock CLK(n) is fed to the drain. The shift clock CLK(n) is fed to the pull-up transistor Tu while the Q node is floating after discharged to VGL. When VGL of the shift clock CLK(n) is fed to the drain of the pull-up transistor Tu, bootstrapping occurs through a parasitic capacitance between the drain and gate of the pull-up transistor Tu, and thus the voltage of the Q node falls to approximately 2VGL. In this case, the pull-up transistor Tu is turned on by the voltage 2VGL of the Q node, and the voltage of the output terminal is discharged to VGL of the shift clock CLK(n). The pull-down transistor Td supplies the gate-off voltage VGH to the output terminal when the QB voltage is discharged to VGL to adjust the output voltage Vout(n) to VGH. The voltage Vgout(n) of the output signal is supplied to a scan line or EM signal line, and is also supplied as a carry signal CRY(n) to CRY(n+4) to the previous and next stages.

The switching circuit 120 discharges the Q node in response to a start pulse VST fed through a VST terminal or a carry signal CRY(n) to CRY(n+4) received from the previous stage, and charges the Q node in response to a signal received through an RST (reset) terminal or VNEXT terminal. A reset signal is applied to the RST terminal to simultaneously reset the Q nodes of all stages ST(1) to ST(n+3). A carry signal generated from the next stage is applied to the VNEXT terminal. The switching circuit 120 may charge and discharge the QB node in reverse from the Q node by using an inverter.

The start pulse VST is applied to the first stage ST(1) of the shift register. The start pulse VST may be applied to one or more stages. The shift clock CLK(n) may be, but not limited to, a two-phase to eight-phase clock.

Figure 26:
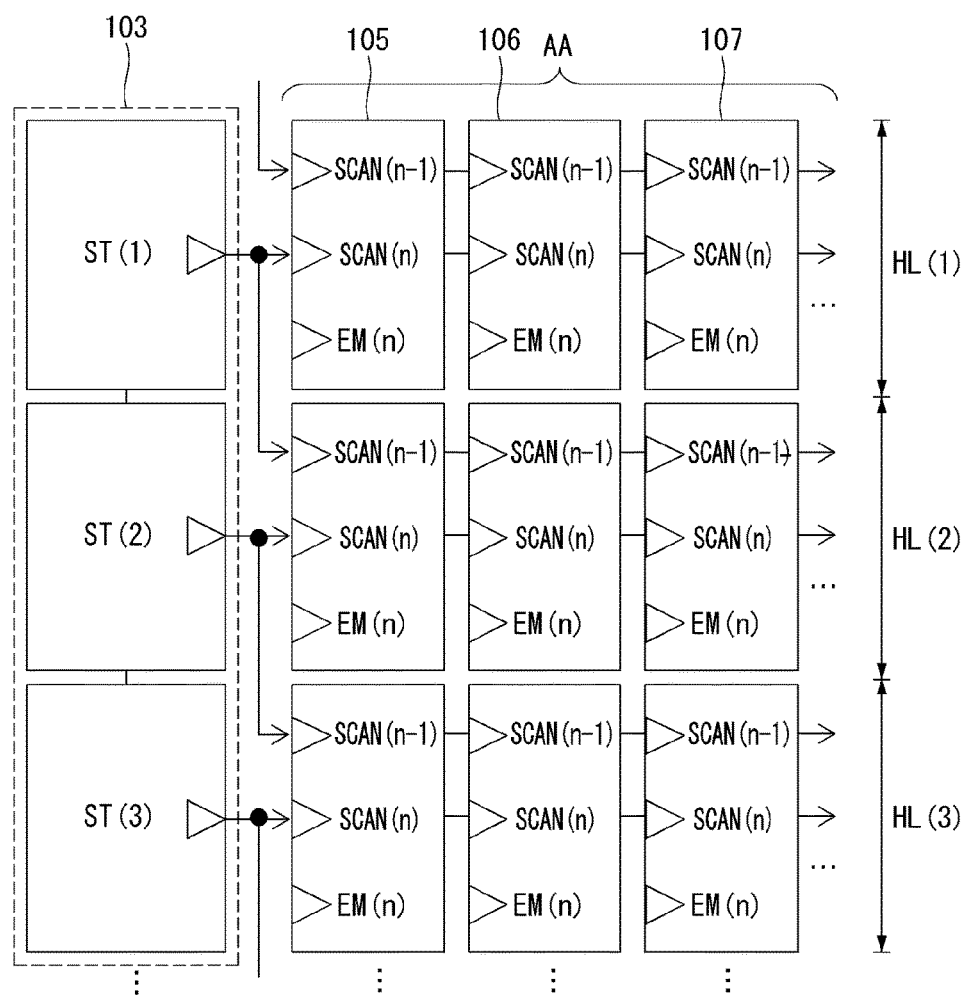
FIG. 26 is a view showing a connection between an output terminal of a scan driver that outputs the scan signals shown in FIGS. 3 to 20 and the screen display part according to an embodiment of the present disclosure.

FIG. 26 is a view showing a connection between an output terminal of the scan driver that outputs the scan signals SCAN(n−1) and SCAN(n) shown in FIGS. 3 to 20 and the screen display part. In FIG. 26, reference numerals "HL(1)", "HL(2)", and "HL(3)" represent horizontal display lines.

Since the scan signals SCAN(n−1) and SCAN(n) are shifted with the same pulse width and a constant phase difference, they may be output from a single shift register without changing the gate timing control signal.

The horizontal display lines comprise a plurality of pixels 105 to 107 neighboring horizontally on the screen display part AA. An (n−2)th scan signal and an (n−1)th scan signal are applied to the pixels 105 to 107 on an (n−1)th horizontal display line, and the (n−1)th scan signal and an nth scan signal are applied to the pixels 105 to 107 on an nth horizontal display line. This means that, in the scan driver 103, one output terminal is shared by two scan lines, and this may reduce the number of output terminals in the scan driver 103. In other words, since two scan signal lines on the display panel 100 may be connected to a single output terminal in the scan driver 103, the size of the scan driver 103 may be reduced, thereby achieving a narrow bezel.

Figure 27:
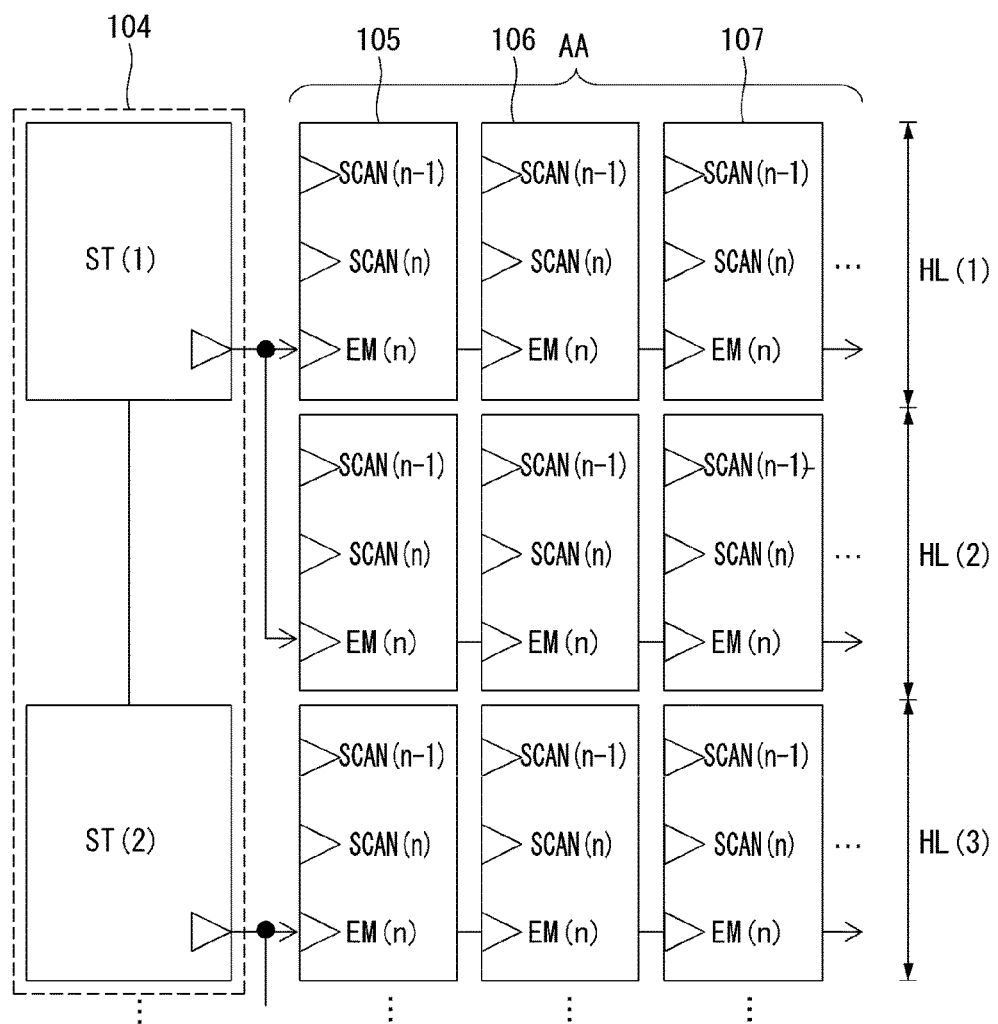
FIG. 27 is a view showing a connection between an output terminal of an emission driver that outputs the emission signal shown in FIGS. 3 to 20 and the screen display part according to an embodiment of the present disclosure.

FIG. 27 is a view showing a connection between an output terminal of the EM driver that outputs the EM signal shown in FIGS. 3 to 20 and the screen display part.

Since the EM signal EM(n&n+1) of FIGS. 4 to 7 has a pulse width of approximately three horizontal periods, it may be shared by two horizontal display lines HL(1) to HL(#) on the screen display part AA. As a consequence, in the EM driver 104, one output terminal may be connected to the pixels 105 to 107 arranged on two neighboring horizontal display lines HL(1) to HL(#). Since the size of the EM driver 104 may be reduced, the bezel area may be reduced by that much. Since two EM signal lines on the display panel 100 may be connected to a single output terminal in the EM driver 104, the size of the EM driver 104 may be reduced, thereby achieving a narrow bezel.

An electroluminescent display device according to an embodiment of the present disclosure will be described as follows.

An electroluminescent display device according to one embodiment of the present disclosure has a display panel including a plurality of pixels. A pixel circuit of each of the plurality of pixels comprises a storage capacitor connected between a first node and a second node, a driving transistor including a gate electrode, a first electrode, and a second electrode, the gate electrode connected to the second node, the first electrode connected to a third node, and the second electrode connected to a first supply voltage, a first transistor connected to the first node, the first transistor supplying the first supply voltage or a reference voltage to the first node in response to a first scan signal, the first supply voltage different from the reference voltage, a second transistor connected to the second node, the second transistor supplying the reference voltage to the second node in response to the first scan signal, a third transistor connected to the first node, the third transistor supplying a data voltage to the first node in response to a second scan signal, a fourth transistor connected to the second node and the third node, the fourth transistor forming a first current path between the second node and the third node in response to the second scan signal, a fifth transistor connected to a fourth node, the fifth transistor supplying the reference voltage or a reset voltage to the fourth node in response to the second scan signal, the reset voltage different from the reference voltage, a sixth transistor connected to the first node, the sixth transistor supplying the reference voltage to the first node in response to an emission control signal, a seventh transistor that is connected to the third node and the fourth node, the seventh transistor forming a second current path between the third node and the fourth node in response to the emission control signal, and an electroluminescent diode with an anode and a cathode, the anode connected to the fourth node and the cathode connected to a second supply voltage, the second supply voltage less than the first supply voltage. Therefore, the present disclosure may achieve uniform picture quality across the entire screen without the need for a VDD wire to have a low-resistance design, and may reduce power consumption since no short-circuit occurs between VDD and Vref.

A change in the first supply voltage may be reflected both at the second node and the second electrode of the driving transistor that is connected to the first supply voltage during a sampling period for sensing a threshold voltage of the driving transistor or during an emission period of the electroluminescent display device during which the electroluminescent diode emits light.

The reference voltage may be greater than the second supply voltage and less than the first supply voltage. The reset voltage may be greater than the second supply voltage and less than the reference voltage. And the first scan signal may be received by each pixel circuit before the pixel circuit receives the second scan signal.

The display panel may comprise a plurality of horizontal display lines and a plurality of vertical display lines, each of the plurality of horizontal display lines formed by pixels on the horizontal display line, and each of the plurality of vertical display lines formed by pixels on the vertical display line.

One frame for driving the pixel circuit may comprise a reset period in which the first scan signal is transmitted to an (n−1)th horizontal display line (n is a positive integer), a sampling period in which the second scan signal is transmitted to an nth horizontal display line, and an emission period in which the electroluminescent diode emits light.

The second transistor and the first transistor may turn on in response to the first scan signal in the reset period. The third transistor, fourth transistor, and fifth transistor may turn on in response to the second scan signal in the sampling period. The sixth transistor and the seventh transistor may be off in the reset period and the sampling period, and the sixth transistor and the seventh transistor may turn on in response to the emission control signal in the emission period.

The fourth transistor and the second transistor may be dual gate transistors.

The first transistor, second transistor, third transistor, fourth transistor, fifth transistor, sixth transistor, seventh transistor, and the driving transistor may be p-type transistors.

The first transistor may be connected between the first node and the first supply voltage.

Where a first pixel is located on an nth horizontal display line (n is a positive integer) and an mth vertical display line (m is a positive integer) and a second pixel is located on an (n+1)th horizontal display line, and the mth vertical display line, the fifth transistor of the first pixel may be connected between the fourth node of the first pixel and the first node of the second pixel.

Where a first pixel is located on an nth horizontal display line (n is a positive integer) and an mth vertical display line (m is a positive integer) and a second pixel is located on an (n+1)th horizontal display line and an (m−1)th vertical display line, the fifth transistor of the first pixel may be connected between the fourth node of the first pixel and the first node of the second pixel.

Where a first pixel is located on an nth horizontal display line (n is a positive integer) and an mth vertical display line (m is a positive integer) and a second pixel is located on the nth horizontal display line and an (m−1)th vertical display line, the second transistor of the first pixel may be connected between the second node of the first pixel and the first node of the second pixel.

Where a first pixel is located on an nth horizontal display line (n is a positive integer) and an mth vertical display line (m is a positive integer), a second pixel is located on an (n+1)th horizontal display line and the mth vertical display line, and a third pixel is located on the nth horizontal display line and an (m−1)th vertical display line, the fifth transistor of the first pixel may be connected between the fourth node of the first pixel and the first node of the second pixel, and the second transistor of the first pixel may be connected between the second node of the first pixel and the first node of the third pixel.

Where a first pixel is located on an nth horizontal display line (n is a positive integer) and an mth vertical display line (m is a positive integer), a second pixel is located on an (n+1)th horizontal display line and an (m−1)th vertical display line, and a third pixel is located on the nth horizontal display line and the (m−1)th vertical display line, the fifth transistor of the first pixel may be connected between the fourth node of the first pixel and the first node of the second pixel, and the second transistor of the first pixel may be connected between the second node of the first pixel and the first node of the third pixel.

The first transistor may be connected between the first node and the reference voltage.

Where a first pixel is located on an nth horizontal display line (n is a positive integer) and an mth vertical display line (m is a positive integer) and a second pixel is located on an (n+1)th horizontal display line and the mth vertical display line, the fifth transistor of the first pixel may be connected between the fourth node of the first pixel and the first node of the second pixel.

Where a first pixel is located on an nth horizontal display line (n is a positive integer) and an mth vertical display line (m is a positive integer) and a second pixel is located on an (n+1)th horizontal display line and an (m−1)th vertical display line, the fifth transistor of the first pixel may be connected between the fourth node of the first pixel and the first node of the second pixel.

Where a first pixel is located on an nth horizontal display line (n is a positive integer) and an mth vertical display line (m is a positive integer) and a second pixel is located on the nth horizontal display line and an (m−1)th vertical display line, the second transistor of the first pixel may be connected between the second node of the first pixel and the first node of the second pixel.

Where a first pixel is located on an nth horizontal display line (n is a positive integer) and an mth vertical display line (m is a positive integer), a second pixel is located on an (n+1)th horizontal display line and the mth vertical display line, and a third pixel is located on the nth horizontal display line and an (m−1)th vertical display line, the fifth transistor of the first pixel may be connected between the fourth node of the first pixel and the first node of the second pixel, and the second transistor of the first pixel may be connected between the second node of the first pixel and the first node of the third pixel.

Where a first pixel is located on an nth horizontal display line (n is a positive integer) and an mth vertical display line (m is a positive integer), a second pixel is located on an (n+1)th horizontal display line and an (m−1)th vertical display line, and a third pixel is located on the nth horizontal display line and the (m−1)th vertical display line, the fifth transistor of the first pixel may be connected between the fourth node of the first pixel and the first node of the second pixel, and the second transistor of the first pixel may be connected between the second node of the first pixel and the first node of the third pixel.

The fifth transistor may be connected between the fourth node and the reset voltage.

The electroluminescent display device may further comprise a scan driver that outputs the first scan signal and the second scan signal, and an emission driver that outputs the emission control signal. An output terminal may be connected to pixels arranged on two adjacent horizontal display lines.

The emission control signal may swing between a first voltage that turns on the sixth transistor and the seventh transistor and a second voltage that turns off the sixth transistor and the seventh transistor during the emission period.

In some embodiments of the present disclosure, the drive current Ioled of the OLED is not affected by VDD, and therefore the brightness and color of the pixels may be uniform across the entire screen, without the VDD wire having a low-resistance design or a mesh configuration. Accordingly, in some embodiments of the present disclosure may achieve uniform picture quality on high-resolution panels with small pixel size.

Since VDD and Vref are not short-circuited within the pixel, in some embodiments of the present disclosure may reduce power consumption and reduce deterioration of pixels, thereby improving reliability.

In some embodiments of the present disclosure may improve the picture quality by minimizing flicker and after-image by switching on/off the emission control signal at a predetermined pulse width modulation duty ratio during the emission period.

In some embodiments of the present disclosure, since Vsg (or Vgs) of the driving TFT during the off period of the emission control signal in the light emission driving period may be stored in the storage capacitor, stable duty driving is possible.

The compensation circuit of in some embodiments of the present disclosure is not complicated in circuit configuration and may be configured in a compact layout, thereby realizing a high-resolution display device having a high PPI (Pixels Per Inch) with a small unit pixel size.

In some embodiments of the present disclosure, the anode voltage of the OLED is initialized by the reference voltage or the initializing voltage in the sampling period, so that the contrast ratio can be prevented from being degraded when the black gray scale and the white gray scale are expressed.

In some embodiments of the present disclosure, two scan lines of the display panel may be connected to one output terminal of the scan driver, and two EM signal lines the display panel may be connected to one output terminal of the EM driver. Therefore, in some embodiments of the present disclosure can realize Narrow Bezel by reducing the number of output terminals of each of the scan driver and the EM driver.

In some embodiments of the present disclosure, the fifth transistor may effectively prevent unnecessary light emission from the OLED during the sampling period without a decrease in contrast ratio as it is connected between the power supply wire to which the reset voltage is applied and the fourth node.

Throughout the description, it should be understood by those skilled in the art that various changes and modifications are possible without departing from the technical principles of the present disclosure. Therefore, the technical scope of the present disclosure is not limited to the detailed descriptions in this specification but should be defined by the scope of the appended claims.

What is claimed is:
1. An electroluminescent display device having a display panel including a plurality of pixels, a pixel circuit of each of the plurality of pixels comprising:
   a storage capacitor connected between a first node and a second node;
   a driving transistor including a gate electrode, a first electrode, and a second electrode, the gate electrode connected to the second node, the first electrode connected to a third node, and the second electrode connected to a first supply voltage;
   a first transistor connected to the first node, the first transistor supplying the first supply voltage or a reference voltage to the first node in response to a first scan signal, the first supply voltage different from the reference voltage;

a second transistor connected to the second node, the second transistor supplying the reference voltage to the second node in response to the first scan signal;

a third transistor connected to the first node, the third transistor supplying a data voltage to the first node in response to a second scan signal;

a fourth transistor connected to the second node and the third node, the fourth transistor forming a first current path between the second node and the third node in response to the second scan signal;

a fifth transistor connected to a fourth node, the fifth transistor supplying the reference voltage or a reset voltage to the fourth node in response to the second scan signal, the reset voltage different from the reference voltage;

a sixth transistor connected to the first node, the sixth transistor supplying the reference voltage to the first node in response to an emission control signal;

a seventh transistor that is connected to the third node and the fourth node, the seventh transistor forming a second current path between the third node and the fourth node in response to the emission control signal; and an electroluminescent diode with an anode and a cathode, the anode connected to the fourth node and the cathode connected to a second supply voltage, the second supply voltage less than the first supply voltage.

2. The electroluminescent display device of claim 1, wherein a change in the first supply voltage is reflected both at the second node and the second electrode of the driving transistor that is connected to the first supply voltage during a sampling period for sensing a threshold voltage of the driving transistor or during an emission period of the electroluminescent display device during which the electroluminescent diode emits light.

3. The electroluminescent display device of claim 1, wherein the reference voltage is greater than the second supply voltage and less than the first supply voltage, the reset voltage is greater than the second supply voltage and less than the reference voltage, and the first scan signal is received by each pixel circuit before the pixel circuit receives the second scan signal.

4. The electroluminescent display device of claim 1, wherein the display panel comprises a plurality of horizontal display lines and a plurality of vertical display lines, each of the plurality of horizontal display lines formed by pixels on the horizontal display line, and each of the plurality of vertical display lines formed by pixels on the vertical display line.

5. The electroluminescent display device of claim 4, wherein one frame for driving the pixel circuit comprises a reset period in which the first scan signal is transmitted to an (n−1)th horizontal display line (n is a positive integer), a sampling period in which the second scan signal is transmitted to an nth horizontal display line, and an emission period in which the electroluminescent diode emits light, wherein the second transistor and the first transistor turn on in response to the first scan signal in the reset period, wherein the third transistor, fourth transistor, and fifth transistor turn on in response to the second scan signal in the sampling period, wherein the sixth transistor and the seventh transistor are off in the reset period and sampling period, and the sixth transistor and the seventh transistor turn on in response to the emission control signal in the emission period.

6. The electroluminescent display device of claim 1, wherein the fourth transistor and the second transistor are dual gate transistors.

7. The electroluminescent display device of claim 1, wherein the first transistor, the second transistor, the third transistor, the fourth transistor, the fifth transistor, the sixth transistor, the seventh transistor and the driving transistor are p-type transistors.

8. The electroluminescent display device of claim 4, wherein the first transistor is connected between the first node and the first supply voltage.

9. The electroluminescent display device of claim 8, wherein where a first pixel is located on an nth horizontal display line (n is a positive integer) and an mth vertical display line (m is a positive integer), and a second pixel is located on an (n+1)th horizontal display line and the mth vertical display line, the fifth transistor of the first pixel is connected between the fourth node of the first pixel and the first node of the second pixel.

10. The electroluminescent display device of claim 8, wherein where a first pixel is located on an nth horizontal display line (n is a positive integer) and an mth vertical display line (m is a positive integer), and a second pixel is located on an (n+1)th horizontal display line and an (m−1)th vertical display line, the fifth transistor of the first pixel is connected between the fourth node of the first pixel and the first node of the second pixel.

11. The electroluminescent display device of claim 8, wherein where a first pixel is located on an nth horizontal display line (n is a positive integer) and an mth vertical display line (m is a positive integer) and a second pixel is located on the nth horizontal display line and an (m−1)th vertical display line, the second transistor of the first pixel is connected between the second node of the first pixel and the first node of the second pixel.

12. The electroluminescent display device of claim 8, wherein where a first pixel is located on an nth horizontal display line (n is a positive integer) and an mth vertical display line (m is a positive integer), a second pixel is located on an (n+1)th horizontal display line and the mth vertical display line, and a third pixel is located on the nth horizontal display line and an (m−1)th vertical display line, the fifth transistor of the first pixel is connected between the fourth node of the first pixel and the first node of the second pixel, and the second transistor of the first pixel is connected between the second node of the first pixel and first node of the third pixel.

13. The electroluminescent display device of claim 8, wherein where a first pixel is located on an nth horizontal display line (n is a positive integer) and an mth vertical display line (m is a positive integer), a second pixel is located on an (n+1)th horizontal display line and an (m−1)th vertical display line, and a third pixel is located on the nth horizontal display line and the (m−1)th vertical display line, the fifth transistor of the first pixel is connected between the fourth node of the first pixel and the first node of the second pixel, and the second transistor of the first pixel is connected between the second node of the first pixel and the first node of the third pixel.

14. The electroluminescent display device of claim 4, wherein the first transistor is connected between the first node and the reference voltage.

15. The electroluminescent display device of claim 14, wherein where a first pixel is located on an nth horizontal display line (n is a positive integer) and an mth vertical display line (m is a positive integer), and a second pixel is located on an (n+1)th horizontal display line and the mth vertical display line, the fifth transistor of the first pixel is connected between the fourth node of the first pixel and the first node of the second pixel.

16. The electroluminescent display device of claim 14, wherein where a first pixel is located on an nth horizontal display line (n is a positive integer) and an mth vertical display line (m is a positive integer), and a second pixel is located on an (n+1)th horizontal display line and an (m−1)th vertical display line, the fifth transistor of the first pixel is connected between the fourth node of the first pixel and the first node of the second pixel.

17. The electroluminescent display device of claim 14, wherein where a first pixel is located on an nth horizontal display line (n is a positive integer) and an mth vertical display line (m is a positive integer), and a second pixel is located on the nth horizontal display line and an (m−1)th vertical display line, the second transistor of the first pixel is connected between the second node of the first pixel and the first node of the second pixel.

18. The electroluminescent display device of claim 14, wherein where a first pixel is located on an nth horizontal display line (n is a positive integer) and an mth vertical display line (m is a positive integer), a second pixel is located on an (n+1)th horizontal display line and the mth vertical display line, and a third pixel is located on the nth horizontal display line and an (m−1)th vertical display line, the fifth transistor of the first pixel is connected between the fourth node of the first pixel and the first node of the second pixel, and the second transistor of the first pixel is connected between the second node of the first pixel and the first node of the third pixel.

19. The electroluminescent display device of claim 14, wherein where a first pixel is located on an nth horizontal display line (n is a positive integer) and an mth vertical display line (m is a positive integer), a second pixel is located on an (n+1)th horizontal display line and an (m−1)th vertical display line, and a third pixel is located on the nth horizontal display line and the (m−1)th vertical display line, the fifth transistor of the first pixel is connected between the fourth node of the first pixel and the first node of the second pixel, and the second transistor of the first pixel is connected between the second node of the first pixel and the first node of the third pixel.

20. The electroluminescent display device of claim 8, wherein the fifth transistor is connected between the fourth node and the reset voltage.

21. The electroluminescent display device of claim 14, wherein the fifth transistor is connected between the fourth node and the reset voltage.

22. The electroluminescent display device of claim 4, further comprising:
a scan driver that outputs the first scan signal and the second scan signal; and an emission driver that outputs the emission control signal,
wherein an output terminal of the emission driver is connected to pixels arranged on two adjacent horizontal display lines.

23. The electroluminescent display device of claim 5, wherein the emission control signal swings between a first voltage that turns on the sixth transistor and the seventh transistor and a second voltage that turns off the sixth transistor and the seventh transistor during the emission period.

* * * * *